(12) United States Patent
Yamazaki et al.

(10) Patent No.: US 12,250,855 B2
(45) Date of Patent: Mar. 11, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Kengo Akimoto, Atsugi (JP); Shigeki Komori, Isehara (JP); Hideki Uochi, Atsugi (JP); Rihito Wada, Atsugi (JP); Yoko Chiba, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 463 days.

(21) Appl. No.: 17/488,376

(22) Filed: Sep. 29, 2021

(65) Prior Publication Data

US 2022/0020841 A1    Jan. 20, 2022

Related U.S. Application Data

(63) Continuation of application No. 15/296,270, filed on Oct. 18, 2016, now Pat. No. 11,139,359, which is a
(Continued)

(30) Foreign Application Priority Data

Sep. 19, 2008    (JP) .................................. 2008-241307

(51) Int. Cl.
*H01L 29/786*    (2006.01)
*H01L 27/12*    (2006.01)
(Continued)

(52) U.S. Cl.
CPC ....... *H10K 59/131* (2023.02); *H01L 27/1225* (2013.01); *H01L 29/7869* (2013.01); *H10K 59/1213* (2023.02); *H10K 50/82* (2023.02)

(58) Field of Classification Search
CPC .............. H10K 59/1213; H10K 59/131; H01L 27/1225; H01L 29/66765; H01L 29/78669; H01L 29/78678; H01L 29/7869
See application file for complete search history.

(56) References Cited

U.S. PATENT DOCUMENTS 5,027,174 A    6/1991    Mimoto
5,731,856 A    3/1998    Kim et al.
(Continued)

FOREIGN PATENT DOCUMENTS

CN    001512253 A    7/2004
CN    001862804 A    11/2006
(Continued)

OTHER PUBLICATIONS

International Search Report (Application No. PCT/JP2009/065460) Dated Dec. 1, 2009.
(Continued)

*Primary Examiner* — Joshua Benitez Rosario
*Assistant Examiner* — John Lin
(74) *Attorney, Agent, or Firm* — Eric J. Robinson; Robinson Intellectual Property Law Office, P.C.

(57) ABSTRACT

A display device includes a pixel portion in which a pixel is arranged in a matrix, the pixel including an inverted staggered thin film transistor having a combination of at least two kinds of oxide semiconductor layers with different amounts of oxygen and having a channel protective layer over a semiconductor layer to be a channel formation region overlapping a gate electrode layer and a pixel electrode layer electrically connected to the inverted staggered thin film transistor. In the periphery of the pixel portion in this display device, a pad portion including a conductive layer made of the same material as the pixel electrode layer is provided. In
(Continued)

addition, the conductive layer is electrically connected to a common electrode layer formed on a counter substrate.

3 Claims, 32 Drawing Sheets

Related U.S. Application Data continuation of application No. 12/556,593, filed on Sep. 10, 2009, now Pat. No. 9,478,597.

(51) Int. Cl.
*H10K 59/121* (2023.01)
*H10K 59/131* (2023.01)
*H10K 50/82* (2023.01)

(56) References Cited

U.S. PATENT DOCUMENTS

| | | | |
|---|---|---|---|
| 5,744,864 A | 4/1998 | Cillessen et al. |
| 5,835,177 A | 11/1998 | Dohjo et al. |
| 5,847,410 A | 12/1998 | Nakajima |
| 5,930,607 A | 7/1999 | Satou |
| 5,936,292 A | 8/1999 | Koide et al. |
| 5,966,190 A | 10/1999 | Dohjo et al. |
| 5,982,471 A | 11/1999 | Hirakata et al. |
| 6,028,652 A | 2/2000 | Dohjo et al. |
| 6,078,366 A | 6/2000 | Dohjo et al. |
| 6,177,974 B1 | 1/2001 | Hirakata et al. |
| 6,191,452 B1 | 2/2001 | Oda et al. |
| 6,278,504 B1 * | 8/2001 | Sung ............... G02F 1/1368 349/42 |
| 6,294,274 B1 | 9/2001 | Kawazoe et al. |
| 6,404,480 B2 | 6/2002 | Hirakata et al. |
| 6,500,701 B2 | 12/2002 | Higashi et al. |
| 6,555,419 B2 | 4/2003 | Oda et al. |
| 6,563,174 B2 | 5/2003 | Kawasaki et al. |
| 6,586,346 B1 | 7/2003 | Yamazaki et al. |
| 6,600,524 B1 | 7/2003 | Ando et al. |
| RE38,292 E | 10/2003 | Satou |
| 6,636,288 B2 | 10/2003 | Kim et al. |
| 6,653,216 B1 | 11/2003 | Shimomaki et al. |
| 6,678,017 B1 | 1/2004 | Shimomaki et al. |
| 6,690,442 B1 | 2/2004 | Kohtaka et al. |
| 6,727,522 B1 | 4/2004 | Kawasaki et al. |
| 6,741,309 B2 | 5/2004 | Kim et al. |
| 6,788,568 B2 | 9/2004 | Hidaka |
| 6,856,374 B1 | 2/2005 | Ozaki et al. |
| 6,867,075 B2 | 3/2005 | Oda et al. |
| 6,882,012 B2 | 4/2005 | Yamazaki et al. |
| 6,888,585 B2 | 5/2005 | Kim |
| 6,922,355 B2 | 7/2005 | Hidaka |
| 6,933,180 B2 | 8/2005 | Tanaka et al. |
| 6,952,021 B2 | 10/2005 | Tanaka et al. |
| 6,960,484 B2 | 11/2005 | Yoo et al. |
| 6,960,812 B2 | 11/2005 | Yamazaki et al. |
| 7,023,017 B2 | 4/2006 | Ahn et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,081,939 B2 | 7/2006 | Kim |
| 7,102,922 B2 | 9/2006 | Hidaka |
| 7,105,868 B2 | 9/2006 | Nause et al. |
| 7,123,332 B2 | 10/2006 | Yamazaki et al. |
| 7,170,570 B2 | 1/2007 | Kim et al. |
| 7,187,423 B2 | 3/2007 | Ozaki et al. |
| 7,211,825 B2 | 5/2007 | Shih et al. |
| 7,273,773 B2 | 9/2007 | Yamazaki et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,339,317 B2 | 3/2008 | Yamazaki |
| 7,351,623 B2 | 4/2008 | Ahn |
| 7,379,366 B2 | 5/2008 | Hidaka |
| 7,385,224 B2 | 6/2008 | Ishii et al. |
| 7,400,087 B2 | 7/2008 | Yamazaki |
| 7,402,506 B2 | 7/2008 | Levy et al. |
| 7,411,209 B2 | 8/2008 | Endo et al. |
| 7,443,478 B2 | 10/2008 | Hirakata et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,527 B2 | 12/2008 | Ahn |
| 7,477,351 B2 | 1/2009 | Kim et al. |
| 7,501,293 B2 | 3/2009 | Ito et al. |
| 7,517,464 B2 | 4/2009 | Matsushita et al. |
| 7,556,988 B2 | 7/2009 | Ahn et al. |
| 7,561,242 B2 | 7/2009 | Hirakata et al. |
| 7,567,454 B2 | 7/2009 | Hidaka |
| 7,579,214 B2 | 8/2009 | Yamazaki et al. |
| 7,583,328 B2 | 9/2009 | Kim |
| 7,601,984 B2 | 10/2009 | Sano et al. |
| 7,616,273 B2 | 11/2009 | Hirakata et al. |
| 7,619,608 B2 | 11/2009 | Lee et al. |
| 7,659,957 B2 | 2/2010 | Park et al. |
| 7,663,302 B2 | 2/2010 | Shin et al. |
| 7,674,650 B2 | 3/2010 | Akimoto et al. |
| 7,687,404 B2 | 3/2010 | Yamazaki et al. |
| 7,732,819 B2 | 6/2010 | Akimoto et al. |
| 7,733,692 B2 | 6/2010 | Hidaka |
| 7,736,936 B2 | 6/2010 | Tanaka |
| 7,749,823 B2 | 7/2010 | Ahn et al. |
| 7,768,617 B2 | 8/2010 | Yamazaki et al. |
| 7,781,759 B2 | 8/2010 | Song et al. |
| 7,804,091 B2 | 9/2010 | Takechi et al. |
| 7,816,682 B2 | 10/2010 | Kimura |
| 7,843,521 B2 | 11/2010 | Yamazaki et al. |
| 7,884,360 B2 | 2/2011 | Takechi et al. |
| 7,893,431 B2 | 2/2011 | Kim et al. |
| 7,910,920 B2 | 3/2011 | Park et al. |
| 7,915,808 B2 | 3/2011 | Yamazaki |
| 7,939,888 B2 | 5/2011 | Yamazaki et al. |
| 7,977,169 B2 | 7/2011 | Hirao et al. |
| 7,977,675 B2 | 7/2011 | Kawamura et al. |
| 7,982,215 B2 | 7/2011 | Inoue et al. |
| 8,000,133 B2 | 8/2011 | Hidaka |
| 8,017,462 B2 | 9/2011 | Ahn |
| 8,030,195 B2 | 10/2011 | Inoue et al. |
| 8,044,392 B2 | 10/2011 | Song et al. |
| 8,045,072 B2 | 10/2011 | Ahn |
| 8,053,269 B2 | 11/2011 | Tanaka |
| 8,063,421 B2 | 11/2011 | Kang et al. |
| 8,158,517 B2 | 4/2012 | Yamamoto et al. |
| 8,232,124 B2 | 7/2012 | Takechi et al. |
| 8,253,179 B2 | 8/2012 | Sakakura et al. |
| 8,268,194 B2 | 9/2012 | Kim et al. |
| 8,304,985 B2 | 11/2012 | Yamazaki |
| 8,305,509 B2 | 11/2012 | Yamazaki et al. |
| 8,319,219 B2 | 11/2012 | Yamazaki |
| 8,338,865 B2 | 12/2012 | Kimura |
| 8,351,253 B2 | 1/2013 | Hidaka |
| 8,373,166 B2 | 2/2013 | Yamazaki |
| 8,409,905 B2 | 4/2013 | Tanaka |
| 8,420,442 B2 | 4/2013 | Takechi et al. |
| 8,421,070 B2 | 4/2013 | Kim et al. |
| RE44,267 E | 6/2013 | Satou |
| 8,518,760 B2 | 8/2013 | Yamazaki et al. |
| 8,614,442 B2 | 12/2013 | Park et al. |
| 8,674,599 B2 | 3/2014 | Yamazaki |
| 8,704,991 B2 | 4/2014 | Chang et al. |
| 8,735,882 B2 | 5/2014 | Kim et al. |
| 8,735,896 B2 | 5/2014 | Yamazaki |
| 8,841,671 B2 | 9/2014 | Kimura |
| 8,872,182 B2 | 10/2014 | Kimura |
| 8,878,262 B2 | 11/2014 | Sakakura et al. |
| 8,889,480 B2 | 11/2014 | Takechi et al. |
| 8,907,559 B2 | 12/2014 | Yamazaki |
| 9,130,049 B2 | 9/2015 | Sano et al. |
| 9,209,026 B2 | 12/2015 | Takechi et al. |
| 9,268,188 B2 | 2/2016 | Kimura |
| 9,362,343 B2 | 6/2016 | Yamazaki |

(56) References Cited

U.S. PATENT DOCUMENTS

| | | | |
|---|---|---|---|
| 9,564,472 B2 | 2/2017 | Yamazaki | |
| 9,583,637 B2 | 2/2017 | Sano et al. | |
| 9,709,861 B2 | 7/2017 | Kimura | |
| 9,917,141 B2 | 3/2018 | Yamazaki | |
| 10,001,678 B2 | 6/2018 | Kimura | |
| 10,192,934 B2 | 1/2019 | Yamazaki | |
| 10,446,615 B2 | 10/2019 | Yamazaki | |
| 10,509,271 B2 | 12/2019 | Kimura | |
| 10,777,615 B2 | 9/2020 | Yamazaki | |
| 2001/0000440 A1 | 4/2001 | Hirakata et al. | |
| 2001/0017683 A1* | 8/2001 | Hiroki | H01L 29/4908 257/E21.414 |
| 2001/0046027 A1 | 11/2001 | Tai et al. | |
| 2002/0043662 A1 | 4/2002 | Yamazaki et al. | |
| 2002/0056838 A1 | 5/2002 | Ogawa | |
| 2002/0109815 A1 | 8/2002 | Hirakata et al. | |
| 2002/0113934 A1 | 8/2002 | Aoki | |
| 2002/0132454 A1 | 9/2002 | Ohtsu et al. | |
| 2003/0122987 A1 | 7/2003 | Kim et al. | |
| 2003/0189401 A1 | 10/2003 | Kido et al. | |
| 2003/0207506 A1 | 11/2003 | Satou | |
| 2003/0210357 A1 | 11/2003 | Hirakata et al. | |
| 2003/0218222 A1 | 11/2003 | Wager, III et al. | |
| 2003/0231276 A1 | 12/2003 | Miki et al. | |
| 2004/0038446 A1 | 2/2004 | Takeda et al. | |
| 2004/0046905 A1* | 3/2004 | Hong | G02F 1/136227 349/43 |
| 2004/0127038 A1 | 7/2004 | Carcia et al. | |
| 2004/0134878 A1 | 7/2004 | Matsushita et al. | |
| 2005/0017302 A1 | 1/2005 | Hoffman | |
| 2005/0078235 A1 | 4/2005 | Ozaki et al. | |
| 2005/0082541 A1 | 4/2005 | Satou | |
| 2005/0084999 A1 | 4/2005 | Satou | |
| 2005/0104071 A1 | 5/2005 | Satou | |
| 2005/0199959 A1 | 9/2005 | Chiang et al. | |
| 2005/0199960 A1* | 9/2005 | Hoffman | H01L 29/7869 257/368 |
| 2005/0233509 A1 | 10/2005 | Satou | |
| 2005/0270469 A1 | 12/2005 | Hirakata et al. | |
| 2005/0270470 A1 | 12/2005 | Hirakata et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0103802 A1 | 5/2006 | Miki et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0121745 A1 | 6/2006 | Fujii | |
| 2006/0169973 A1 | 8/2006 | Isa et al. | |
| 2006/0170111 A1 | 8/2006 | Isa et al. | |
| 2006/0186414 A1 | 8/2006 | Hwang et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0013855 A1 | 1/2007 | Ando et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0091218 A1 | 4/2007 | Huang et al. | |
| 2007/0108446 A1 | 5/2007 | Akimoto | |
| 2007/0126664 A1 | 6/2007 | Kimura | |
| 2007/0139600 A1 | 6/2007 | Lee et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0262347 A1 | 11/2007 | You | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083927 A1 | 4/2008 | Nishiura et al. | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0191213 A1 | 8/2008 | Bae et al. | |
| 2008/0197350 A1 | 8/2008 | Park et al. | |
| 2008/0198108 A1 | 8/2008 | Aoki | |
| 2008/0203387 A1 | 8/2008 | Kang et al. | |
| 2008/0224133 A1 | 9/2008 | Park et al. | |
| 2008/0246064 A1 | 10/2008 | Kimura | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0001374 A1 | 1/2009 | Inoue et al. | |
| 2009/0008639 A1 | 1/2009 | Akimoto et al. | |
| 2009/0050890 A1 | 2/2009 | Hirakata et al. | |
| 2009/0061569 A1 | 3/2009 | Hirakata et al. | |
| 2009/0065771 A1* | 3/2009 | Iwasaki | H01L 29/66969 257/E21.409 |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0161057 A1 | 6/2009 | Kim et al. | |
| 2009/0179199 A1 | 7/2009 | Sano et al. | |
| 2009/0244423 A1 | 10/2009 | Hirakata et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0072468 A1 | 3/2010 | Yamazaki et al. | |
| 2010/0072469 A1 | 3/2010 | Yamazaki et al. | |
| 2010/0092800 A1 | 4/2010 | Itagaki et al. | |
| 2010/0109002 A1 | 5/2010 | Itagaki et al. | |
| 2010/0289026 A1 | 11/2010 | Yamazaki et al. | |
| 2011/0133183 A1 | 6/2011 | Yamazaki et al. | |
| 2011/0141100 A1 | 6/2011 | Park et al. | |
| 2012/0028391 A1 | 2/2012 | Tanaka | |
| 2014/0252360 A1 | 9/2014 | Sakakura et al. | |
| 2017/0125605 A1 | 5/2017 | Sano et al. | |
| 2019/0033668 A1 | 1/2019 | Kimura | |
| 2019/0235323 A1 | 8/2019 | Kimura | |
| 2020/0117061 A1 | 4/2020 | Kimura | |
| 2020/0411603 A1 | 12/2020 | Yamazaki | |

FOREIGN PATENT DOCUMENTS

| | | |
|---|---|---|
| CN | 101101872 A | 1/2008 |
| CN | 101136359 A | 3/2008 |
| CN | 101159273 A | 4/2008 |
| EP | 1737044 A | 12/2006 |

(56) References Cited

FOREIGN PATENT DOCUMENTS

| | | |
|---|---|---|
| EP | 1770788 A | 4/2007 |
| EP | 1933293 A | 6/2008 |
| EP | 1981085 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264770 A | 12/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 06-222026 A | 8/1994 |
| JP | 07-263700 A | 10/1995 |
| JP | 08-264794 A | 10/1996 |
| JP | 09-160076 A | 6/1997 |
| JP | 10-268335 A | 10/1998 |
| JP | 11-015022 A | 1/1999 |
| JP | 11-505377 | 5/1999 |
| JP | 11-160267 A | 6/1999 |
| JP | 11-202366 A | 7/1999 |
| JP | 2000-044236 A | 2/2000 |
| JP | 2000-105390 A | 4/2000 |
| JP | 2000-150900 A | 5/2000 |
| JP | 2000-206568 A | 7/2000 |
| JP | 2001-005030 A | 1/2001 |
| JP | 2001-125137 A | 5/2001 |
| JP | 2001-147649 A | 5/2001 |
| JP | 2001-250949 A | 9/2001 |
| JP | 2001-291870 A | 10/2001 |
| JP | 2001-330860 A | 11/2001 |
| JP | 2002-006773 A | 1/2002 |
| JP | 2002-023662 A | 1/2002 |
| JP | 2002-076356 A | 3/2002 |
| JP | 2002-116451 A | 4/2002 |
| JP | 2002-214638 A | 7/2002 |
| JP | 2002-277892 A | 9/2002 |
| JP | 2002-289859 A | 10/2002 |
| JP | 2003-069028 A | 3/2003 |
| JP | 2003-086000 A | 3/2003 |
| JP | 2003-086808 A | 3/2003 |
| JP | 2003-273134 A | 9/2003 |
| JP | 2004-103957 A | 4/2004 |
| JP | 2004-212964 A | 7/2004 |
| JP | 2004-273614 A | 9/2004 |
| JP | 2004-273732 A | 9/2004 |
| JP | 2004-361937 A | 12/2004 |
| JP | 2005-077635 A | 3/2005 |
| JP | 2005-243951 A | 9/2005 |
| JP | 2005-244197 A | 9/2005 |
| JP | 2005-338855 A | 12/2005 |
| JP | 2005-338877 A | 12/2005 |
| JP | 2005-352465 A | 12/2005 |
| JP | 2006-049847 A | 2/2006 |
| JP | 2006-100760 A | 4/2006 |
| JP | 2006-338013 A | 12/2006 |
| JP | 2007-096055 A | 4/2007 |
| JP | 2007-123861 A | 5/2007 |
| JP | 2007-140727 A | 6/2007 |
| JP | 2007-150158 A | 6/2007 |
| JP | 2007-235102 A | 9/2007 |
| JP | 2007-248694 A | 9/2007 |
| JP | 2007-250982 A | 9/2007 |
| JP | 2007-250983 A | 9/2007 |
| JP | 2007-293072 A | 11/2007 |
| JP | 2008-033337 A | 2/2008 |
| JP | 2008-040343 A | 2/2008 |
| JP | 2008-042088 A | 2/2008 |
| JP | 2008-060419 A | 3/2008 |
| JP | 2008-065225 A | 3/2008 |
| JP | 2008-085313 A | 4/2008 |
| JP | 2008-112136 A | 5/2008 |
| JP | 2008-145768 A | 6/2008 |
| JP | 2008-166716 A | 7/2008 |
| JP | 2008-182209 A | 8/2008 |
| JP | 2008-533693 | 8/2008 |
| JP | 2008-205469 A | 9/2008 |
| JP | 2008-219008 A | 9/2008 |
| JP | 2009-260002 A | 11/2009 |
| KR | 10-0185815 | 3/1999 |
| KR | 1999-0036849 A | 5/1999 |
| KR | 2000-0066953 A | 11/2000 |
| KR | 2004-0002522 A | 1/2004 |
| KR | 2005-0009179 A | 1/2005 |
| KR | 2005-0042991 A | 5/2005 |
| KR | 2005-0112645 A | 12/2005 |
| KR | 2006-0124141 A | 12/2006 |
| KR | 2007-0019249 A | 2/2007 |
| KR | 2007-0020923 A | 2/2007 |
| KR | 10-0695303 | 3/2007 |
| KR | 10-0713383 | 5/2007 |
| KR | 2007-0070740 A | 7/2007 |
| KR | 2007-0090182 A | 9/2007 |
| KR | 2007-0107210 A | 11/2007 |
| KR | 2007-0111351 A | 11/2007 |
| KR | 2008-0011824 A | 2/2008 |
| KR | 2008-0043092 A | 5/2008 |
| KR | 2008-0053489 A | 6/2008 |
| KR | 2008-0076608 A | 8/2008 |
| KR | 2008-0076747 A | 8/2008 |
| WO | WO-1997/013177 | 4/1997 |
| WO | WO-2000/051993 | 9/2000 |
| WO | WO-2004/114391 | 12/2004 |
| WO | WO-2006/025609 | 3/2006 |
| WO | WO-2007/094501 | 8/2007 |
| WO | WO-2007/108293 | 9/2007 |
| WO | WO-2007/119386 | 10/2007 |
| WO | WO-2007/120010 | 10/2007 |
| WO | WO-2008/069056 | 6/2008 |
| WO | WO-2008/069255 | 6/2008 |
| WO | WO-2008/100039 | 8/2008 |

OTHER PUBLICATIONS

Written Opinion (Application No. PCT/JP2009/065460) Dated Dec. 1, 2009.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The Blue Phase", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

MO.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Chinese Office Action (Application No. 200980137844.8) Dated Jan. 16, 2013.

Korean Office Action (Application No. 2013-7004078) Dated Jan. 21, 2014.

Taiwanese Office Action (Application No. 98131227) Dated Jun. 16, 2014.

Korean Office Action (Application No. 2011-7008092) Dated Aug. 6, 2015.

Chinese Office Action (Application No. 201310468513.0) Dated Sep. 6, 2015.

Chinese Office Action (Application No. 201310468513.0) Dated May 5, 2016.

Korean Office Action (Application No. 2016-7028516) Dated Jun. 1, 2017.

\* cited by examiner

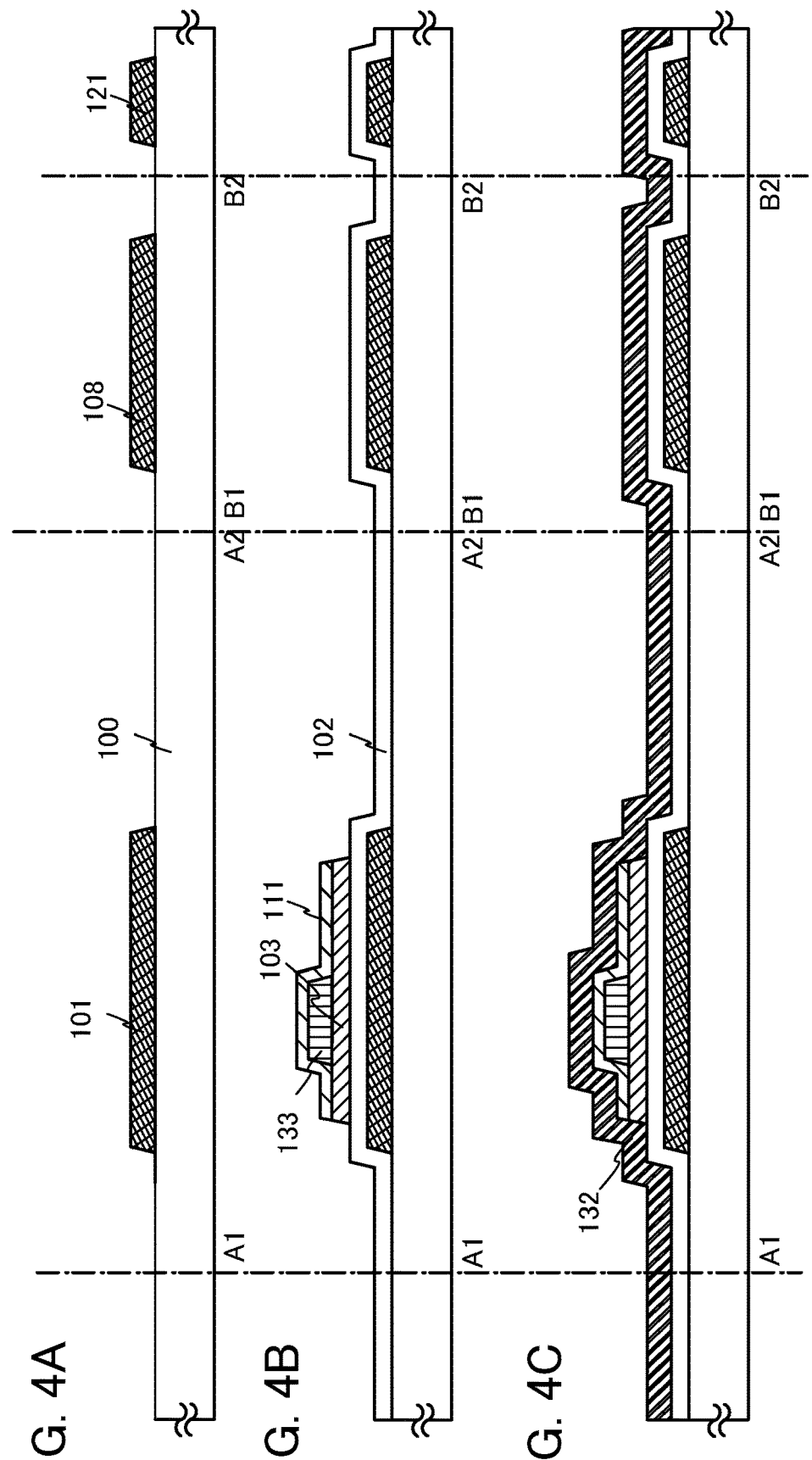

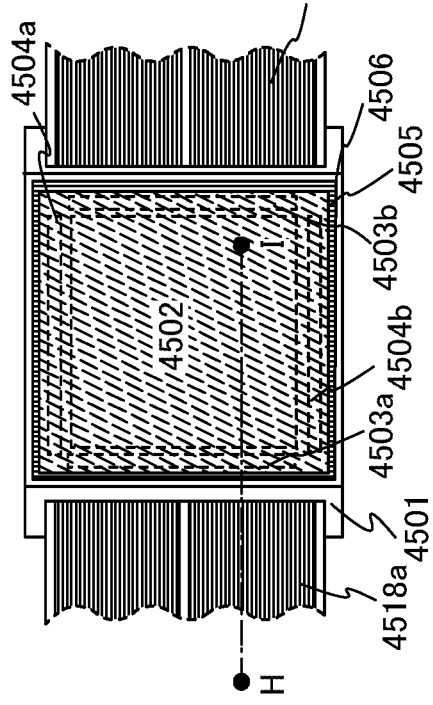
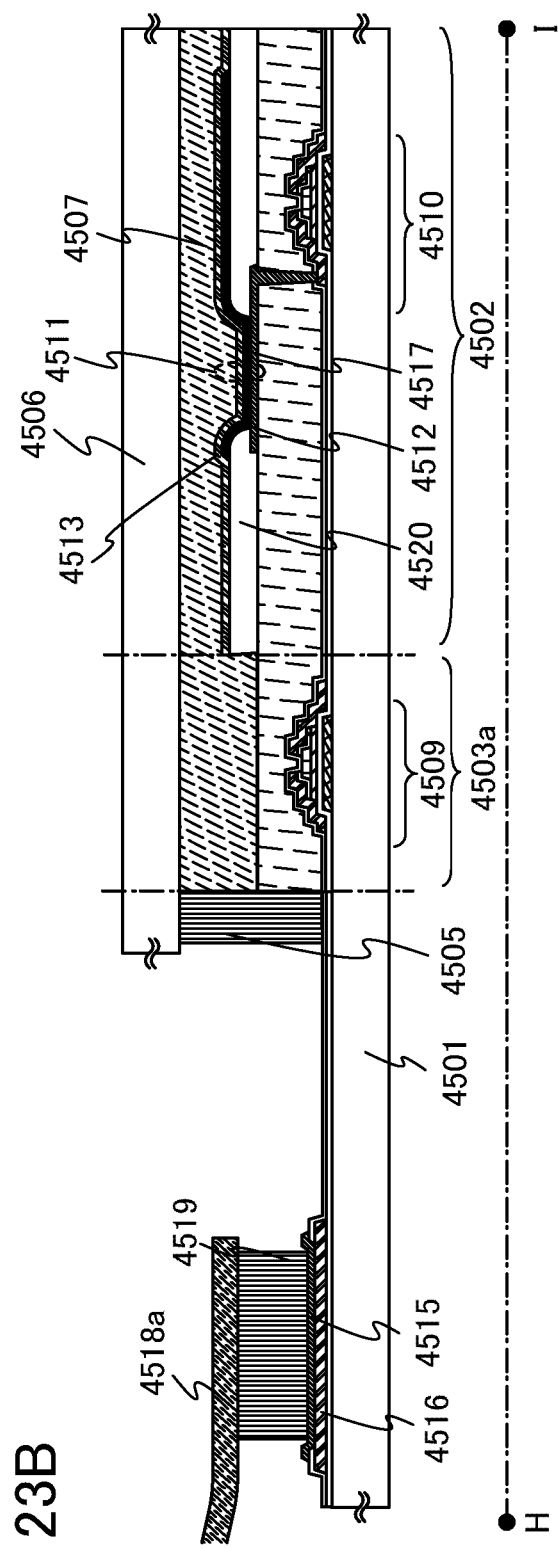
FIG. 23A
FIG. 23B

SEMICONDUCTOR DEVICE

TECHNICAL FIELD

The present invention relates to a display device using an oxide semiconductor and a method for manufacturing the same.

BACKGROUND ART

As typically seen in a liquid crystal display device, a thin film transistor formed on a flat plate such as a glass substrate is manufactured using amorphous silicon or polycrystalline silicon. A thin film transistor using amorphous silicon has a low field effect mobility, but can be formed on a large glass substrate. On the other hand, a thin film transistor using crystalline silicon has a high field effect mobility, but cannot always be formed on a large glass substrate because of a need of a crystallization process such as laser annealing.

In view of the foregoing, techniques in which a thin film transistor is manufactured using an oxide semiconductor and applied to electronic devices or optical devices have attracted attention. Examples of the techniques are disclosed in Patent Document 1 and Patent Document 2, where a thin film transistor is manufactured with zinc oxide or an In—Ga—Zn—O based oxide semiconductor used for an oxide semiconductor film and is used as a switching element or the like of an image display device.

REFERENCE

[Patent Document 1] Japanese Published Patent Application No. 2007-123861
[Patent Document 2] Japanese Published Patent Application No. 2007-96055

DISCLOSURE OF INVENTION

The field effect mobility of a thin film transistor using an oxide semiconductor in a channel formation region is higher than that of a thin film transistor using amorphous silicon. The oxide semiconductor film can be formed by sputtering or the like at a temperature of 300° C. or lower. Its manufacturing process is easier than that of a thin film transistor using polycrystalline silicon.

Such an oxide semiconductor is expected to be used for forming a thin film transistor on a glass substrate, a plastic substrate, or the like, and to be applied to a liquid crystal display device, an electroluminescent display device, electronic paper, or the like.

The oxide semiconductor thin film transistor has superior operating characteristics and can be manufactured at a low temperature. However, in order to make efficient use of these features, the structure and manufacturing conditions of elements need to be optimized, and it is also necessary to consider the structure of wirings needed to input and output signals and the connection structure of the wirings. Although an oxide semiconductor film can be formed at a low temperature, a product can be defective if a thin film of a metal or the like used for a wiring or an electrode, or an insulating film such as an interlayer insulating film, is separated. In addition, if the connection resistance of electrodes in a common connection portion provided on an element substrate side of a display panel is high, there is a problem that spots appear on a display screen and thus the luminance is decreased.

An object of an embodiment of the present invention is to provide a structure suitable for a common connection portion provided in a display panel.

Another object of an embodiment of the present invention is to prevent a defect due to the separation of a thin film in various kinds of display devices that are manufactured using stacked layers of an oxide semiconductor, an insulating film, and a conductive film.

According to an embodiment of the present invention, a display device includes a pixel portion in which a scan line and a signal line cross each other and a pixel electrode layer is arranged in a matrix, and an inverted staggered thin film transistor having a channel protective layer and a combination of at least two kinds of oxide semiconductor layers with different amounts of oxygen is provided corresponding to the pixel electrode layer. In the periphery of the pixel portion in this display device, a pad portion is provided to be electrically connected to a common electrode layer facing the pixel electrode layer through a conductive layer made of the same material as the scan line and the signal line.

According to an exemplary mode of the present invention, a display device includes a pixel portion having a thin film transistor connected to a pixel electrode, and a pad portion electrically connected to a common electrode facing the pixel electrode, and the display device includes the following structures.

In the pixel portion, a scan line and a signal line cross each other and a pixel electrode layer is arranged in a matrix. The thin film transistor is provided corresponding to the pixel electrode layer, and includes a gate electrode layer connected to the scan line, a gate insulating layer covering the gate electrode layer, a first oxide semiconductor layer to be a channel formation region, a channel protective layer covering the first oxide semiconductor layer that overlaps the gate electrode layer, a second oxide semiconductor layer over the first oxide semiconductor layer and the channel protective layer, which is to be a source region and a drain region, and a source electrode layer and a drain electrode layer over the first oxide semiconductor layer, the channel protective layer, and the second oxide semiconductor layer.

The pad portion is provided in the periphery of the pixel portion, and includes an insulating layer formed using the same layer as the gate insulating layer, a conductive layer over the insulating layer, which is formed using the same layer as the source electrode layer and the drain electrode layer, and an interlayer insulating layer over the conductive layer. The pad portion can be electrically connected to a common electrode layer facing the pixel electrode layer through an opening in the interlayer insulating layer.

According to an exemplary mode of the present invention, the pad portion provided in the periphery of the pixel portion may have another structure: a first conductive layer formed using the same layer as the gate electrode layer, an insulating layer formed using the same layer as the gate insulating layer, and a second conductive layer formed using the same layer as the source electrode layer and the drain electrode layer are stacked in this order. The pad portion can be electrically connected to a common electrode layer facing the pixel electrode layer through an opening in an interlayer insulating layer provided over the second conductive layer.

In the aforementioned structures, the pad portion may have a structure in which an oxide semiconductor layer formed using the same layer as the second oxide semiconductor layer is provided between the insulating layer formed using the same layer as the gate insulating layer and the second conductive layer.

The oxide semiconductor layer (the first oxide semiconductor layer) used as a channel formation region of the semiconductor layer has a higher oxygen concentration than the oxide semiconductor layer (the second oxide semiconductor layer) used as a source region and a drain region. It can be said that the first oxide semiconductor layer is an oxygen-excess oxide semiconductor layer and the second oxide semiconductor layer is an oxygen-deficient oxide semiconductor layer.

The second oxide semiconductor layer has n-type conductivity and has a higher electric conductivity than the first oxide semiconductor layer. Therefore, the source region and the drain region using the second oxide semiconductor layer have a lower resistance than the semiconductor layer using the first oxide semiconductor layer.

The first oxide semiconductor layer has an amorphous structure, and the second oxide semiconductor layer includes a crystal grain (nanocrystal) in the amorphous structure in some cases. Note that the crystal grain (nanocrystal) in the second oxide semiconductor layer has a diameter of 1 nm to 10 nm, and typically about 2 nm to 4 nm.

Note that ordinal numbers such as "first" and "second" in this specification are used for convenience. Therefore, they do not denote the order of steps, the stacking order of layers, and particular names which specify the invention.

As the first oxide semiconductor layer to be a channel formation region and/or the second oxide semiconductor layer to be a source region and a drain region, an oxide semiconductor film containing In, Ga, and Zn can be used. Any one of the elements In, Ga, and Zn may be substituted by tungsten, molybdenum, titanium, nickel, or aluminum.

In this specification, a semiconductor layer formed using an oxide semiconductor film containing In, Ga, and Zn is also referred to as an "IGZO semiconductor layer". The IGZO semiconductor layer is a non-single-crystal semiconductor layer and includes as least an amorphous component.

A substrate having a surface on which a pixel electrode layer and a thin film transistor electrically connected to the pixel electrode layer are formed is fixed to a counter substrate with an adhesive called a sealant.

In a liquid crystal display device, a liquid crystal material is sealed between two substrates with a sealant.

The sealant is mixed with a plurality of conductive particles (such as plastic particles plated with gold), whereby a counter electrode (also referred to as a first common electrode) provided on the counter substrate is electrically connected a second common electrode or a common potential line on the other substrate.

The common potential line can be formed over the same substrate through the same manufacturing process as the thin film transistor.

In addition, a portion where the common potential line overlaps the conductive particles in the sealant can be called a common connection portion. The portion where the common potential line overlaps the conductive particles can also be called a common electrode.

The common potential line formed over the same substrate as the thin film transistor can be referred to as a line to supply a voltage to be used as a reference when a liquid crystal is driven by an alternating current.

In addition to the common potential line connected to the counter electrode, a capacitor wiring connected to one electrode of a storage capacitor can be regarded as a variation of the common potential line and formed over the same substrate as the thin film transistor in a similar way.

A display device using an electrophoretic display element, which is also referred to as electronic paper, has a structure in which white particles, black particles having a polarity opposite to the white particles, and a dispersion medium (gas or liquid) for dispersing them are included between a pair of substrates. An electrode provided over one of the pair of substrates is a common electrode. Pixel electrodes are provided over the other substrate so as to face the common electrode, and a plurality of thin film transistors electrically connected to the pixel electrodes are also arranged over the substrate. In the operation of the display device using an electrophoretic display element, for example, a positive voltage relative to a reference potential applied to the common electrode is applied to the pixel electrode for turning a white display to a black display; a negative voltage relative to the reference potential applied to the common electrode is applied to the pixel electrode for turning the black display to the white display; and the pixel electrode for not changing the display is set at the same potential as the common potential.

The common potential line formed over the same substrate as the thin film transistor can be referred to as a line to supply a voltage to be used as a reference when the electrophoretic display element is operated.

Note that the display device using an electrophoretic display element includes a plurality of separated spaces of a uniform size formed by the pair of substrates and partitions provided between the pair of substrates. A separated space serves as a pixel unit for displaying part of an image. A separated space includes a plurality of white particles, black particles having a polarity opposite to the white particles, and a dispersion medium (gas or liquid) for dispersing them.

Also in the display device using an electrophoretic display element, a plurality of colored particles having different polarities and the dispersion medium for dispersing them are sealed between the two substrates with a sealant. In addition, in the display device using an electrophoretic display element, a common electrode provided over one substrate and a common potential line formed over the other substrate are electrically connected through conductive particles in a common connection portion.

A plastic film can be used as a material for the pair of substrates used in the liquid crystal display device or the display device using an electrophoretic display element, depending on a temperature of the manufacturing process.

The gate insulating layer, the first oxide semiconductor layer to be a channel formation region, the second oxide semiconductor layer to be a source region and a drain region, and the source electrode layer and the drain electrode layer may be formed by sputtering (a sputter method).

Examples of sputtering include an RF sputtering in which a high-frequency power source is used for a sputtering power source, a DC sputtering, and a pulsed DC sputtering in which a bias is applied in a pulsed manner. The RF sputtering is mainly used in the case of forming an insulating film, and the DC sputtering is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering in which a target substance and a sputtering gas component are chemically reacted with each other during deposition to form a thin compound film thereof, and a bias sputtering in which voltage is also applied to a substrate during deposition.

By any of these varieties of sputtering methods, the gate insulating layer, the semiconductor layer, the source region and the drain region, and the source electrode layer and the drain electrode layer are formed.

In the case where an IGZO semiconductor layer is used as the first oxide semiconductor layer (the oxygen-excess oxide semiconductor layer) and the second oxide semiconductor layer (the oxygen-deficient oxide semiconductor layer), the first oxide semiconductor layer and the second oxide semiconductor layer are formed under different deposition conditions. The second oxide semiconductor layer to be a source region and a drain region is deposited under such conditions that a crystal grain having a diameter of 1 nm to 10 nm is contained immediately after the deposition. For example, if the second oxide semiconductor layer is deposited by DC sputtering with the use of a target of $In_2O_3:Ga_2O_3:ZnO=1:1:1$ while introducing an argon gas and oxygen at a flow rate ratio of 2:1 or introducing only an argon gas, a film containing a crystal grain having a diameter of 1 nm to 10 nm is obtained in some cases immediately after the deposition. Note that the target of $In_2O_3:Ga_2O_3:ZnO=1:1:1$ is deliberately designed to have such a ratio in order to obtain an amorphous oxide semiconductor film. Therefore, the composition ratio of the target may be changed so that the crystallinity of the source region and the drain region is further improved. In order to simplify the process and reduce the cost, it is preferable that the first oxide semiconductor layer to be a channel formation region and the second oxide semiconductor layer to be a source region and a drain region be separately formed by using the same target and changing only the introduced gas.

A titanium film is preferably formed for the source electrode layer and the drain electrode layer.

In sputtering, a high energy is applied to a target by Ar ions; therefore, it is considered that a high strain energy exists in the deposited oxide semiconductor layer (typically, the IGZO semiconductor layer). In order to release the strain energy, heat treatment is preferably performed at 200° C. to 600° C., and typically 300° C. to 500° C. This heat treatment involves the rearrangement at the atomic level. The deposition and heat treatment (including light annealing) are important because the strain that inhibits the movement of carriers can be released by this heat treatment.

Note that the semiconductor devices in this specification indicate all the devices that can operate by using semiconductor characteristics, and an electro-optical device, a semiconductor circuit, and an electronic appliance are all included in the semiconductor devices.

According to an embodiment of the present invention, a structure suitable for a pad portion provided in a display panel can be provided.

According to an embodiment of the present invention, the oxide semiconductor layer and the conductive layer are stacked in the pad portion provided in the periphery of the pixel portion, whereby a defect due to separation of a thin film can be prevented. In addition, by adopting the stacked structure of the oxide semiconductor layer and the conductive layer, the thickness of the pad portion increases and the resistance thereof decreases, resulting in an increase in the strength of the structure.

According to an embodiment of the present invention, a thin film transistor having a small amount of photocurrent, low parasitic capacitance, a high on-off ratio, and good dynamic characteristics can be manufactured.

Thus, a display device having high electrical properties and high reliability can be provided according to an embodiment of the present invention.

BRIEF DESCRIPTION OF DRAWINGS

In the accompanying drawings:

FIGS. 4A to 4C are diagrams illustrating a method for manufacturing a semiconductor device;

FIGS. 23A and 23B are diagrams illustrating a semiconductor device;

BEST MODE FOR CARRYING OUT THE INVENTION

Figure 1A:
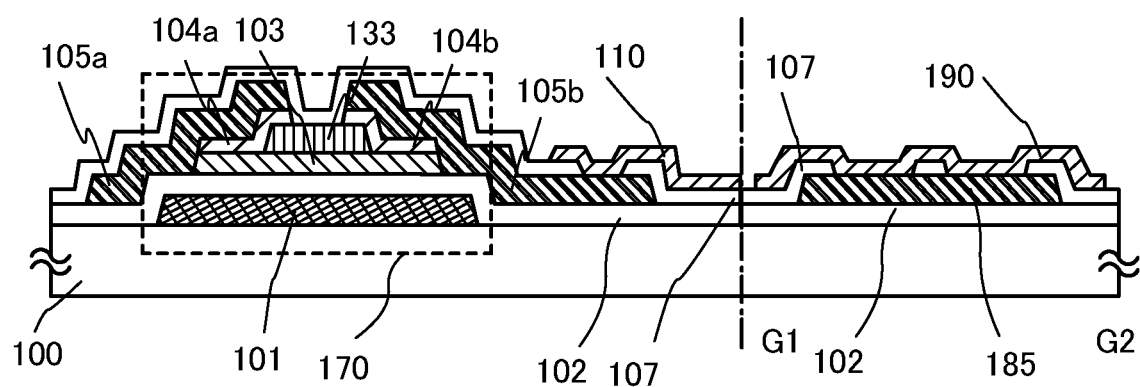
FIGS. 1A and 1B are diagrams illustrating a semiconductor device.

Embodiments of the present invention will be described in detail with reference to drawings. Note that the present invention is not limited to the description below, and it is apparent to those skilled in the art that modes and details can be modified in various ways without departing from the spirit and scope of the present invention. Accordingly, the present invention should not be construed as being limited to the description of the embodiments given below. Note that in the structures of the present invention described below, like portions or portions having a similar function are denoted by like reference numerals, and the description thereof is omitted.

Embodiment Mode 1

This embodiment shows an example of a liquid crystal display device in which a liquid crystal layer is sealed between a first substrate and a second substrate, and a common connection portion (a pad portion) is formed over the first substrate to be electrically connected to a counter electrode provided on the second substrate. Note that a thin film transistor is formed as a switching element over the first substrate, and the common connection portion is manufactured in the same process as the switching element in a pixel portion, thereby being obtained without complicating the process.

The common connection portion is provided in a position overlapping a sealant for bonding the first substrate and the second substrate and is electrically connected to a counter electrode through conductive particles in the sealant. Alternatively, the common connection portion is provided in a position which does not overlap the sealant (except for the pixel portion) and a paste including conductive particles is provided separately from the sealant so as to overlap the common connection portion, whereby the common connection portion can be electrically connected to the counter electrode through the conductive particles in the paste.

FIG. 1A is a cross-sectional view of a semiconductor device in which a thin film transistor and a common connection portion are formed over the same substrate. Note that the thin film transistor illustrated in FIG. 1A is an inverted staggered thin film transistor having a channel protective layer. A channel protective layer 133 is provided over a channel formation region of a semiconductor layer 103, and source and drain electrode layers 105a and 105b are provided over the semiconductor layer 103 and the channel protective layer 133 with source and drain regions 104a and 104b interposed therebetween.

In this embodiment, the semiconductor layer 103 having a channel formation region is a non-single-crystal semiconductor layer containing In, Ga, Zn, and O (a first oxide semiconductor layer), and includes at least an amorphous component. The source and drain regions 104a and 104b are an oxide semiconductor layer containing In, Ga, Zn, and O (a second oxide semiconductor layer), which is formed under different conditions from the semiconductor layer 103 and has a lower oxygen concentration and lower resistance than the semiconductor layer 103. The source and drain regions 104a and 104b has n-type conductivity and an activation energy ($\Delta E$) of 0.01 eV to 0.1 eV, and can also be referred to as an n$^+$ region. Note that the source and drain regions 104a and 104b are a non-single-crystal semiconductor layer containing In, Ga, Zn, and O, and include at least an amorphous component. Thus, the oxide semiconductor layer used for the semiconductor layer 103 is an oxygen-excess oxide semiconductor layer, and the oxide semiconductor layer used for the source and drain regions is an oxygen-deficient semiconductor layer.

When an oxygen-deficient oxide semiconductor layer is provided as the source and drain regions 104a and 104b, a junction between the source and drain electrode layers 105a and 105b that are metal layers and the semiconductor layer 103 (the oxygen-excess oxide semiconductor layer) is favorable and has higher thermal stability than Schottky junction. In addition, it is important to positively provide source and drain regions in order to supply carriers to a channel (on the source side), stably absorb carriers from a channel (on the drain side), or prevent resistance from occurring at an interface with a source electrode layer (or a drain electrode layer). A reduction in resistance allows good mobility to be kept even at high drain voltage.

Since the channel protective layer 133 is provided over the channel formation region of the semiconductor layer 103, the channel formation region of the semiconductor layer 103 can be prevented from being damaged in the process (plasma generated in etching, reduction in thickness due to an etchant, oxidization, or the like can be prevented). Accordingly, the reliability of a thin film transistor 170 can be improved.

Figure 1B:
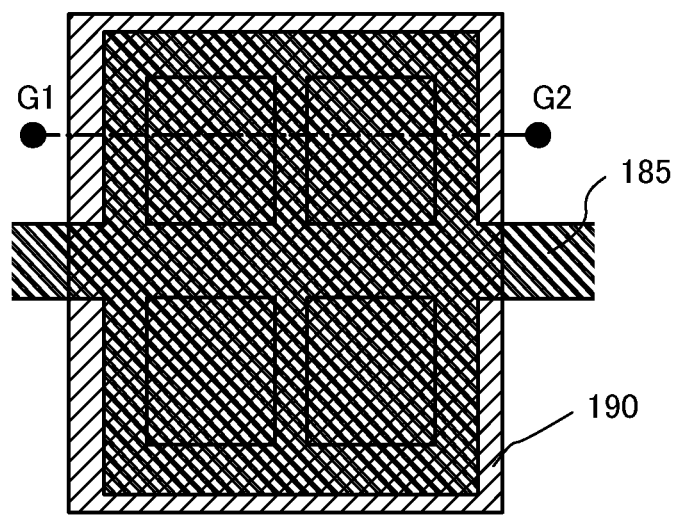

FIG. 1B illustrates an example of a top view of the common connection portion, and dashed line G1-G2 in FIG. 1B corresponds to a cross section of the common connection portion of FIG. 1A. Note that in FIG. 1B, portions similar to those in FIG 1A are denoted by the same reference numerals.

The common potential line 185 is provided over the gate insulating layer 102 and manufactured of the same material and in the same process as the source and drain electrode layers 105a and 105b.

The common potential line 185 is covered with the protective insulating layer 107, and the protective insulating layer 107 has a plurality of openings at positions overlapping the common potential line 185. These openings are manufactured in the same process as a contact hole for connecting the source electrode layer 105a or drain electrode layer 105b and the pixel electrode layer 110.

Note that the contact hole in the pixel portion and the openings in the common connection portion are distinctively described because their sizes differ considerably. In FIG. 1A, the pixel portion and the common connection portion are not illustrated on the same scale. For example, the length of dashed line G1-G2 in the common connection portion is about 500 μm, and the width of the thin film transistor is less than 50 μm; thus, the area of the common connection portion is ten times or more as large as that of the thin film transistor. However, the scales of the pixel portion and the common connection portion are changed in FIG. 1A for simplification.

The common electrode layer 190 is provided over the protective insulating layer 107 and manufactured of the same material and in the same process as the pixel electrode layer 110 in the pixel portion.

In this manner, the common connection portion is manufactured in the same process as the switching element in the pixel portion.

Then, the first substrate 100 provided with the pixel portion and the common connection portion is fixed to a second substrate provided with a counter electrode with a sealant.

In the case where the sealant contains conductive particles, the pair of substrates (also referred to the first substrate and the second substrate) are aligned so that the sealant overlaps the common connection portion. For example, in the case of a small liquid crystal panel, two common connection portions overlap the sealant at opposite corners of the pixel portion and the like. In the case of a large liquid crystal panel, four or more common connection portions overlap the sealant.

Note that the common electrode layer 190 is an electrode in contact with the conductive particles contained in the sealant, and is electrically connected to the counter electrode of the second substrate.

In the case of using a liquid crystal injection method, the pair of substrates are fixed with a sealant, and then a liquid crystal is injected between the pair of substrates. In the case of using a liquid crystal dropping method, a sealant is drawn on the second substrate or the first substrate and a liquid crystal is dropped thereon; then, the pair of substrates are bonded to each other under a reduced pressure.

This embodiment shows an example of the common connection portion electrically connected to the counter electrode. However, the present invention is not particularly limited to this example and can be applied to a connection portion connected to another wiring or a connection portion connected to an external connection terminal or the like.

For example, in the case of manufacturing a light-emitting display device, unlike a liquid crystal display device, there is no connection portion to be connected to a counter electrode. Instead, the light-emitting display device has a portion to connect a cathode (negative electrode) of a light-emitting element to a common wiring, and the portion may have the same connection structure as that illustrated in FIG. 1A. The cathode of the light-emitting element may have a connection portion for each pixel. Alternatively, the connection portion may be provided between a pixel portion and a driver circuit portion.

Embodiment 2

Figure 2A:
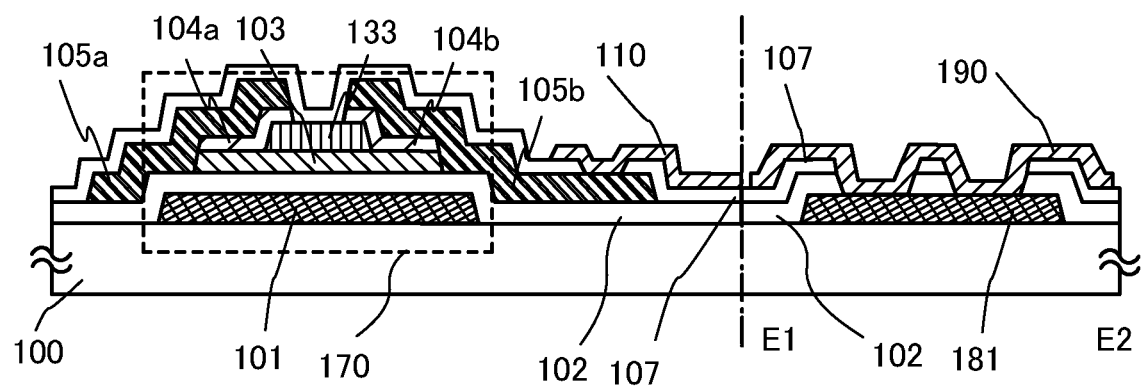
FIGS. 2A and 2B are diagrams illustrating a semiconductor device.
Figure 2B:
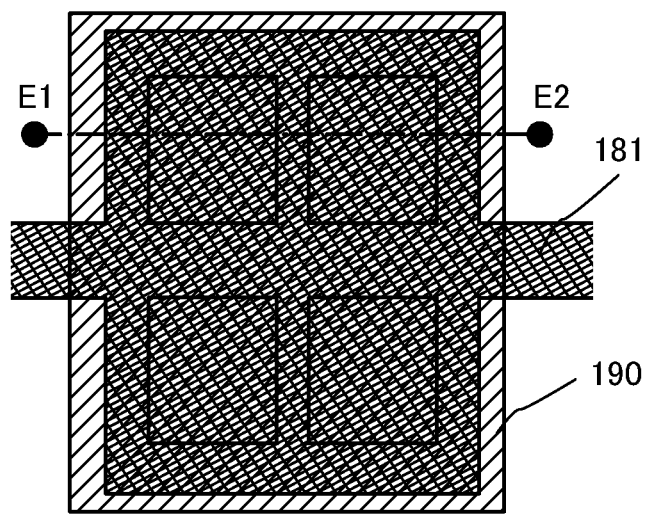

In this embodiment, an example of manufacturing a common connection portion (a pad portion), in which a wiring formed of the same material and in the same process as a gate wiring is used as a common potential line, will be illustrated in FIGS. 2A and 2B.

FIG. 2B illustrates an example of a top view of a common connection portion, and dashed line E1-E2 in FIG. 2B corresponds to a cross section of the common connection portion of FIG. 2A.

Note that as illustrated in FIG. 2A, a thin film transistor in a pixel portion has the same structure as that of Embodiment 1; thus, portions similar to those in FIG. 1A are denoted by the same reference numerals and detailed description is omitted here.

A common potential line 181 is provided over the first substrate 100 and manufactured of the same material and in the same process as a gate electrode layer 101.

In addition, the common potential line 181 is covered with the gate insulating layer 102 and the protective insulating layer 107. The gate insulating layer 102 and the protective insulating layer 107 have a plurality of openings at positions overlapping the common potential line 181. These openings, unlike in Embodiment 1, have a large depth which corresponds to the thickness of the two insulating layers. Note that these openings are manufactured by etching in the same process as a contact hole for connecting the source electrode layer 105a or drain electrode layer 105b and the pixel electrode layer 110, and then further etching the gate insulating layer 102 selectively.

The common electrode layer 190 is provided over the protective insulating layer 107 and manufactured of the same material and in the same process as the pixel electrode layer 110 in the pixel portion.

In this manner, the common connection portion is manufactured in the same process as the switching element in the pixel portion.

Then, the first substrate 100 provided with the pixel portion and the common connection portion is fixed to a second substrate provided with a counter electrode with a sealant.

In the case where the sealant contains conductive particles, the pair of substrates are aligned so that the sealant overlaps the common connection portion.

Note that the common electrode layer 190 is an electrode in contact with the conductive particles contained in the sealant, and is electrically connected to the counter electrode of the second substrate.

In the case of using a liquid crystal injection method, the pair of substrates are fixed with a sealant, and then a liquid crystal is injected between the pair of substrates. In the case of using a liquid crystal dropping method, a sealant is drawn on the second substrate or the first substrate and a liquid crystal is dropped thereon; then, the pair of substrates are bonded to each other under a reduced pressure.

This embodiment shows an example of the common connection portion electrically connected to the counter electrode. However, the present invention is not particularly limited to this example and can be applied to a connection portion connected to another wiring or a connection portion connected to an external connection terminal or the like.

Embodiment 3

Figure 3A:
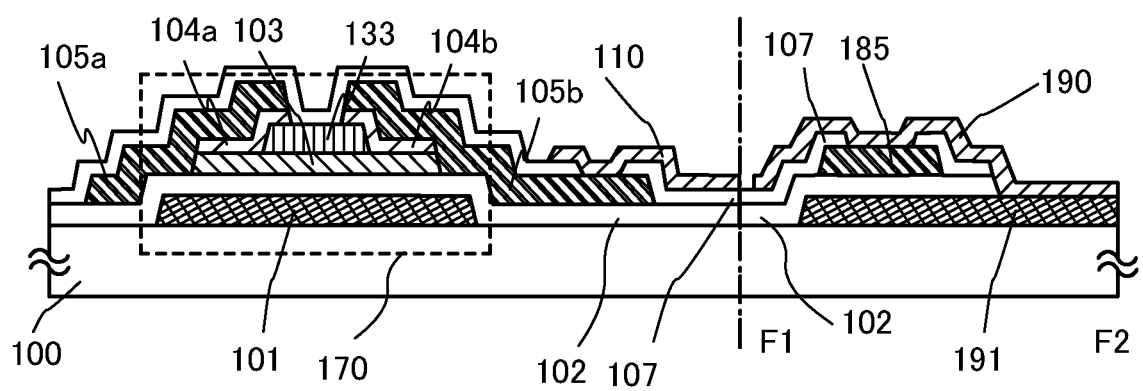
FIGS. 3A and 3B are diagrams illustrating a semiconductor device.
Figure 3B:
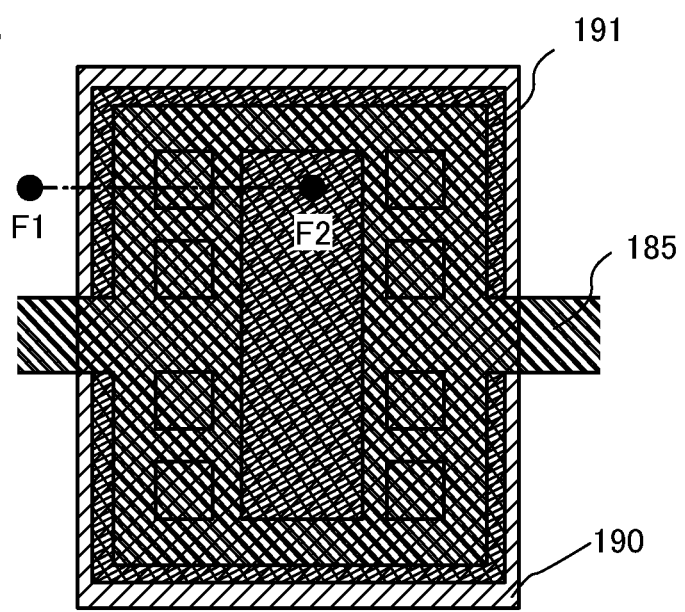

In this embodiment, an example of manufacturing a common connection portion (a pad portion), in which an electrode formed of the same material and in the same process as a gate wiring is formed and a wiring formed of the same material and in the same process as a source electrode layer is provided as a common potential line over the electrode, will be illustrated in FIGS. 3A and 3B.

FIG. 3B illustrates an example of a top view of a common connection portion, and dashed line F1-F2 in FIG. 3B corresponds to a cross section of the common connection portion of FIG. 3A.

Note that as illustrated in FIG. 3A, a thin film transistor in a pixel portion has the same structure as that of Embodiment 1; thus, portions similar to those in FIG. 1A are denoted by the same reference numerals and detailed description is omitted here.

A connection electrode layer 191 is provided over the first substrate 100 and manufactured of the same material and in the same process as the gate electrode layer 101.

In addition, the connection electrode layer 191 is covered with the gate insulating layer 102 and the protective insulating layer 107. The gate insulating layer 102 and the protective insulating layer 107 have an opening at a position overlapping the common electrode layer 190. This opening, unlike in Embodiment 1, has a large depth which corresponds to the thickness of the two insulating layers. Note that this opening is manufactured by etching in the same process as a contact hole for connecting the source electrode layer 105a or drain electrode layer 105b and the pixel electrode layer 110, and then further etching the gate insulating layer 102 selectively.

The common potential line 185 is provided over the gate insulating layer 102 and manufactured of the same material and in the same process as the source and drain electrode layers 105a and 105b.

The common potential line 185 is covered with the protective insulating layer 107, and the protective insulating layer 107 has a plurality of openings at positions overlapping the common potential line 185. These openings are manufactured in the same process as a contact hole for connecting the source electrode layer 105a or drain electrode layer 105b and the pixel electrode layer 110.

The common electrode layer 190 is provided over the protective insulating layer 107 and manufactured of the same material and in the same process as the pixel electrode layer 110 in the pixel portion.

In this manner, the common connection portion is manufactured in the same process as the switching element in the pixel portion.

Then, the first substrate 100 provided with the pixel portion and the common connection portion is fixed to a second substrate provided with a counter electrode with a sealant.

Note that in this embodiment, a plurality of conductive particles are selectively disposed in the opening of the gate insulating layer 102. That is, the plurality of conductive particles are disposed in a region where the common electrode layer 190 and the connection electrode layer 191 are in contact with each other. The common electrode layer 190 connecting both the connection electrode layer 191 and the common potential line 185 is electrically connected to the counter electrode of the second substrate through the conductive particles.

In the case of using a liquid crystal injection method, the pair of substrates are fixed with a sealant, and then a liquid crystal is injected between the pair of substrates. In the case of using a liquid crystal dropping method, a sealant is drawn on the second substrate or the first substrate and a liquid crystal is dropped thereon; then, the pair of substrates are bonded to each other under a reduced pressure.

This embodiment shows an example of the common connection portion electrically connected to the counter electrode. However, the present invention is not particularly limited to this example and can be applied to a connection portion connected to another wiring or a connection portion connected to an external connection terminal or the like.

Embodiment 4

Figure 29A:
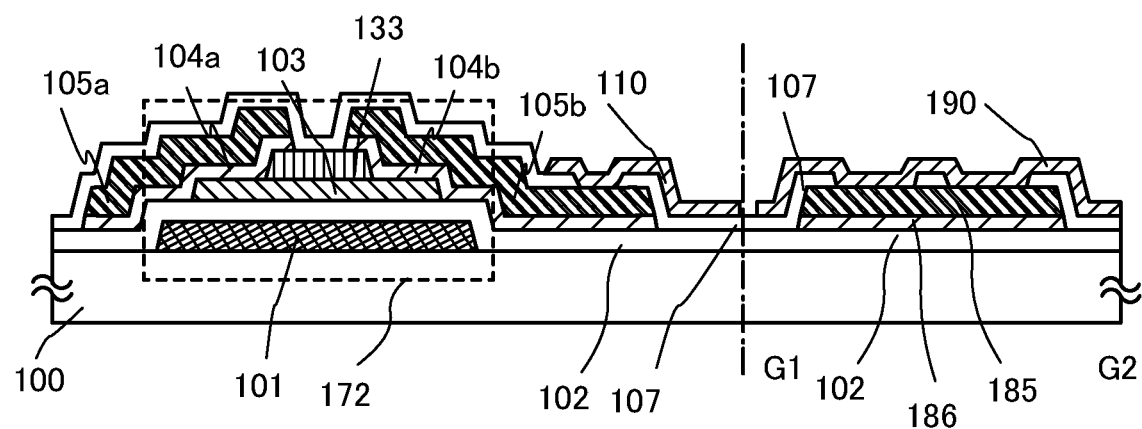
FIGS. 29A and 29B are diagrams illustrating a semiconductor device.
Figure 29B:
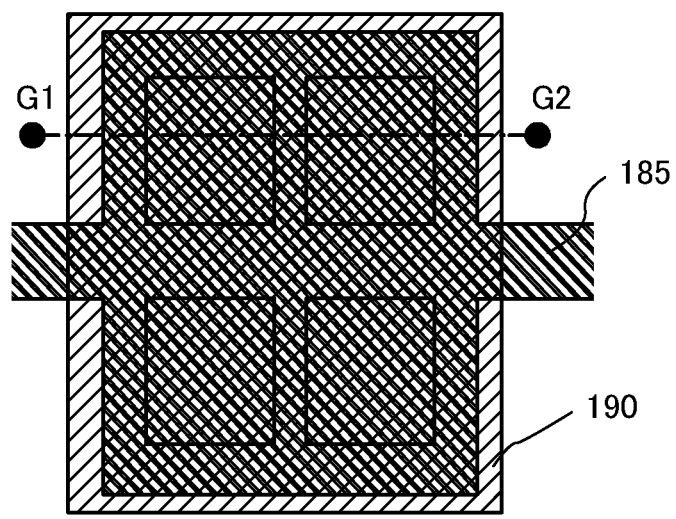

In this embodiment, another example of the display device shown in Embodiment 1, in which source and drain electrode layers and source and drain regions are formed by etching using the same mask, will be illustrated in FIGS. 29A and 29B.

FIG. 29A is a cross-sectional view of a semiconductor device in which a thin film transistor and a common connection portion (a pad portion) are manufactured over the same substrate. A thin film transistor 172 illustrated in FIG. 29A is an inverted staggered thin film transistor having a channel protective layer. The channel protective layer 133 is provided over a channel formation region of the semiconductor layer 103, and the source and drain electrode layers 105a and 105b are provided over the semiconductor layer 103 and the channel protective layer 133 with the source and drain regions 104a and 104b interposed therebetween. In the thin film transistor 172, an oxide semiconductor layer forming the source and drain regions 104a and 104b and a conductive layer forming the source and drain electrode layers 105a and 105b are etched using the same mask.

Therefore, in the thin film transistor 172, the source and drain electrode layers 105a and 105b and the source and drain regions 104a and 104b have the same shape, and the source and drain regions 104a and 104b are placed under the source and drain electrode layers 105a and 105b.

Accordingly, also in the common connection portion, an oxide semiconductor layer 186 manufactured of the same material and in the same process as the source and drain regions 104a and 104b is formed between the gate insulating layer 102 and the common potential line 185.

Note that FIG. 29B illustrates an example of a top view of the common connection portion, and dashed line G1-G2 in FIG. 29B corresponds to a cross section of the common connection portion of FIG. 29A.

Note that as illustrated in FIG. 29B, the top view of the common connection portion has the same structure as that of Embodiment 1; thus, portions similar to those in FIG. 1B are denoted by the same reference numerals and detailed description is omitted here.

According to this embodiment, the oxide semiconductor layer and the conductive layer are stacked in the common connection portion (the pad portion) provided in the periphery of the pixel portion, whereby a defect due to separation of a thin film can be prevented. In addition, by adopting the stacked structure of the oxide semiconductor layer and the conductive layer, the thickness of the pad portion increases and the resistance thereof decreases, resulting in an increase in the strength of the structure.

Embodiment 5

Figure 30A:
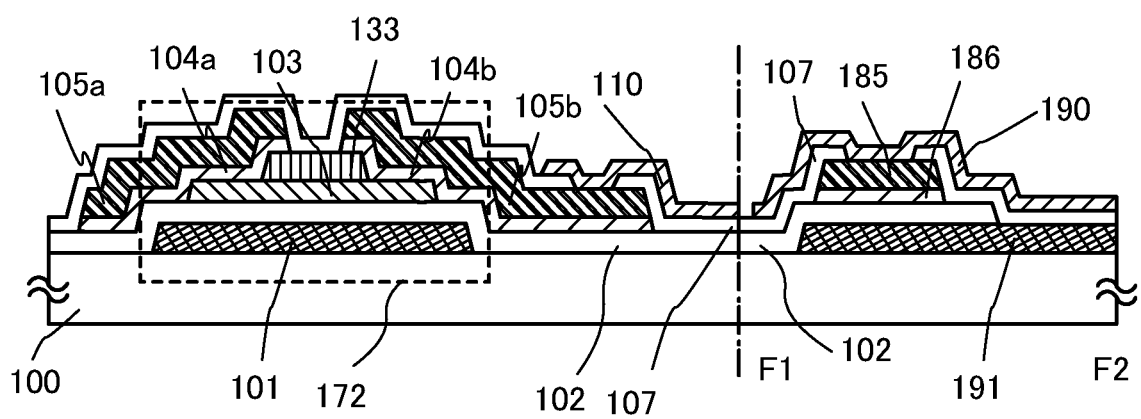
FIGS. 30A and 30B are diagrams illustrating a semiconductor device.
Figure 30B:
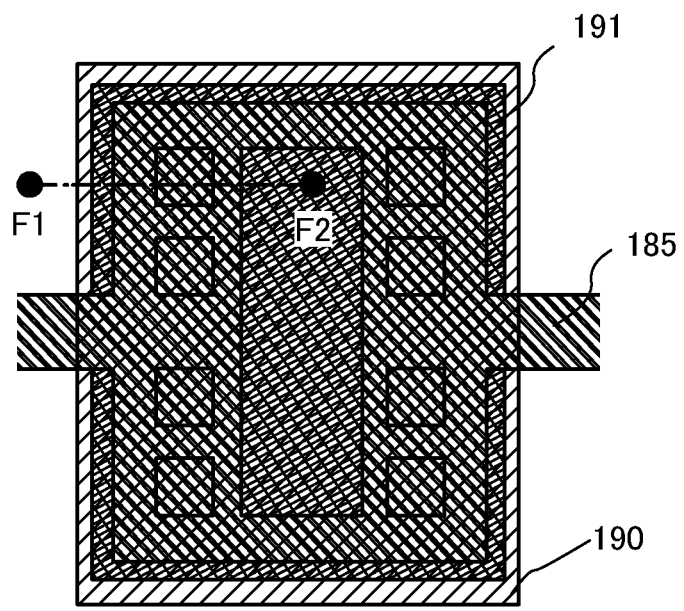

In this embodiment, another example of the display device shown in Embodiment 3, in which source and drain electrode layers and source and drain regions are formed by etching using the same mask, will be illustrated in FIGS. 30A and 30B.

FIG. 30A is a cross-sectional view of a semiconductor device in which a thin film transistor and a common connection portion (a pad portion) are manufactured over the same substrate.

Note that as illustrated in FIG. 30A, a thin film transistor in a pixel portion has the same structure as that of Embodiment 4; thus, portions similar to those in FIG. 29A are denoted by the same reference numerals and detailed description is omitted here.

In the thin film transistor 172, an oxide semiconductor layer forming the source and drain regions 104a and 104b and a conductive layer forming the source and drain electrode layers 105a and 105b are etched using the same mask. Therefore, in the thin film transistor 172, the source and drain electrode layers 105a and 105b and the source and drain regions 104a and 104b have the same shape, and the source and drain regions 104a and 104b are placed under the source and drain electrode layers 105a and 105b.

Also in the common connection portion, the oxide semiconductor layer 186 manufactured of the same material and in the same process as the source and drain regions 104a and 104b is formed between the gate insulating layer 102 and the common potential line 185.

FIG. 30B illustrates an example of a top view of a common connection portion, and dashed line F1-F2 in FIG. 30B corresponds to a cross section of the common connection portion of FIG. 30A.

Note that as illustrated in FIG. 30B, the top view of the common connection portion has the same structure as that of Embodiment 3; thus, portions similar to those in FIG. 3B are denoted by the same reference numerals and detailed description is omitted here.

According to this embodiment, the oxide semiconductor layer and the conductive layer are stacked in the common connection portion (the pad portion) provided in the periphery of the pixel portion, whereby a defect due to separation of a thin film can be prevented. In addition, by adopting the stacked structure of the oxide semiconductor layer and the conductive layer, the thickness of the pad portion increases and the resistance thereof decreases, resulting in an increase in the strength of the structure.

Embodiment 6

In this embodiment, a manufacturing process of a display device including a thin film transistor of one embodiment of the present invention will be described with reference to FIGS. 4A to 4C, FIGS. 5A to 5C, FIGS. 6 to 9, FIGS. 10A and 10B, and FIG. 11. The thin film transistor included in the display device of the present invention is an inverted staggered thin film transistor having a channel protective layer.

In FIG. 4A, as the first substrate 100 having a light transmitting property, it is possible to use a glass substrate made of barium borosilicate glass, aluminoborosilicate glass, or the like typified by #7059 glass, #1737 glass, or the like manufactured by Corning Incorporated.

Figure 6:
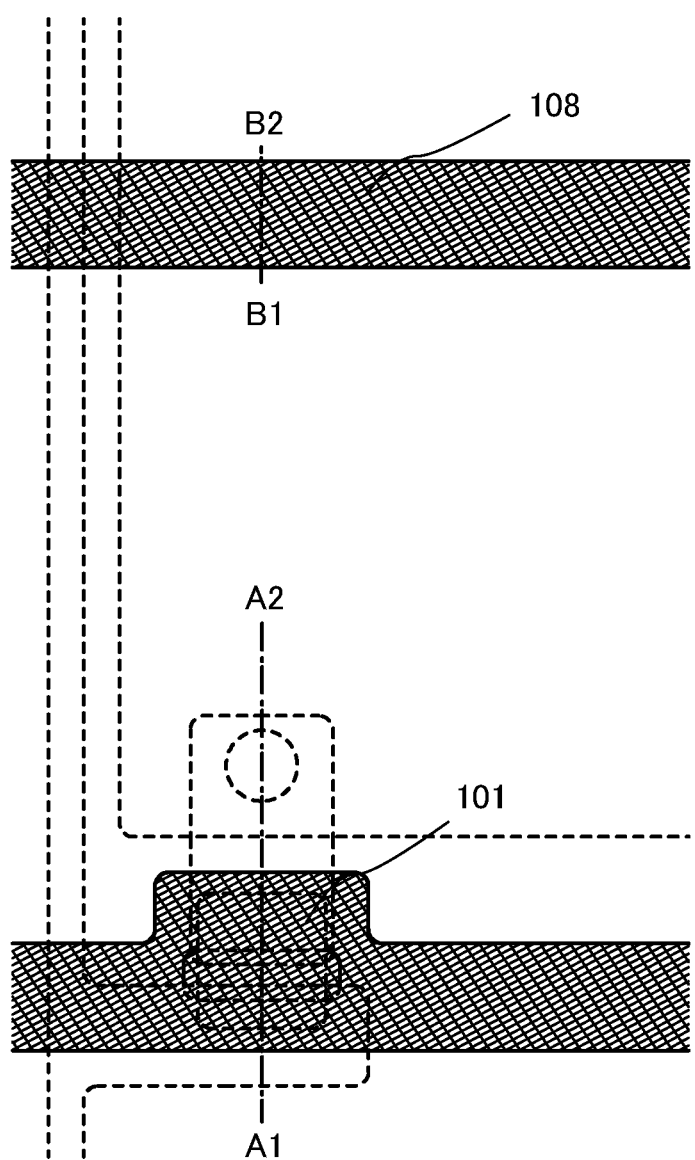
FIG. 6 is a diagram illustrating a method for manufacturing a semiconductor device.

After a conductive layer is formed on the entire surface of the first substrate 100, a resist mask is formed by a first photolithography step. Then, unnecessary portions are removed by etching, thereby forming wirings and electrodes (a gate wiring including the gate electrode layer 101, a capacitor wiring 108, and a first terminal 121). At that time, etching is performed so that at least the edge of the gate electrode layer 101 is tapered. A cross-sectional view at this stage is illustrated in FIG. 4A. Note that FIG. 6 is a top view at this stage.

The gate wiring including the gate electrode layer 101, the capacitor wiring 108, and the first terminal 121 in the terminal portion are preferably formed of a low-resistant conductive material such as aluminum (Al) or copper (Cu). However, aluminum alone has the disadvantages of low heat resistance, being easily corroded, and the like; thus, it is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

Then, the gate insulating layer 102 is formed on the entire surface of the gate electrode layer 101. The gate insulating layer 102 is formed to a thickness of 50 nm to 250 nm by sputtering or the like.

For example, as the gate insulating layer 102, a silicon oxide film is formed to a thickness of 100 nm by sputtering. It is needless to say that the gate insulating layer 102 is not limited to such a silicon oxide film, and other insulating films such as a silicon oxynitride film, a silicon nitride film, an aluminum oxide film, or a tantalum oxide film may be used to form a single-layer structure or a multi-layer structure.

The surface of the gate insulating layer may be cleaned by plasma treatment before forming an oxide semiconductor layer (an IGZO semiconductor layer) that is to be a channel formation region. It is effective to perform plasma treatment to remove dust such as organic substances on the surface of the gate insulating layer. It is also effective that the surface of the gate insulating layer is subjected to plasma treatment to be an oxygen-excess region, which serves as an oxygen supply source to modify the interface between the gate insulating layer and the IGZO semiconductor layer in heat treatment (200° C. to 600° C.) to increase reliability in subsequent steps.

After the plasma treatment, an oxide semiconductor layer is preferably deposited by sputtering without being exposed to the atmosphere. If a deposition target substrate is exposed to the atmosphere before an oxide semiconductor layer is deposited, moisture or the like is attached to the deposition target substrate, which may adversely affect the interface state leading to variations in threshold values, degradation of electrical properties, production of a normally-on TFT, and the like. The plasma treatment is performed using oxygen gas or argon gas. Instead of argon gas, other rare gases may be used.

In order that an oxide semiconductor layer to be a channel formation region is deposited by sputtering without being exposed to the atmosphere after the plasma treatment, a kind of plasma treatment called reverse sputtering treatment, which can be performed in the same chamber as formation of the oxide semiconductor layer, is preferably performed. The reverse sputtering treatment is a method in which voltage is applied to a substrate side in an oxygen atmosphere or an oxygen and argon atmosphere without applying voltage to a target side, so that plasma is generated to modify the surface of a thin film on the substrate.

In the case where the plasma treatment is performed in a chamber filled with oxygen gas, the surface of the gate insulating layer is exposed to oxygen radicals to be modified into an oxygen-excess region, thereby increasing the oxygen concentration at the interface with an oxide semiconductor layer which is deposited later to be a channel formation region. In other words, if oxygen radical treatment is performed on the gate insulating layer and an oxide semiconductor layer is stacked thereon, and then heat treatment is performed , the oxygen concentration of the oxide semiconductor layer to be a channel formation region on the gate insulating layer side can also be increased. Accordingly, the oxygen concentration reaches a peak at the interface between the gate insulating layer and the oxide semiconductor layer to be a channel formation region, and the oxygen concentration of the gate insulating layer has a concentration gradient which increases toward the interface between the gate insulating layer and the oxide semiconductor layer to be a channel formation region. The gate insulating layer including an oxygen-excess region is compatible with the oxide semiconductor layer to be a channel formation region that is an oxygen-excess oxide semiconductor layer, so that favorable interface properties between the gate insulating layer and the oxygen-excess oxide semiconductor layer can be obtained.

Oxygen radicals may be produced in a plasma generation apparatus with the use of a gas containing oxygen, or in an ozone generation apparatus. By exposing a thin film to the produced oxygen radicals or oxygen, the surface of the film can be modified.

The plasma treatment is not limited to one using oxygen radicals, and may be performed using argon and oxygen radicals. The treatment using argon and oxygen radicals is treatment in which argon gas and oxygen gas are introduced to generate plasma, thereby modifying the surface of a thin film.

Argon atoms (Ar) in a reaction space where an electric field is applied to generate discharge plasma are excited or ionized by electrons (e) in the discharge plasma, thereby being converted into argon radicals (Ar*), argon ions (Ar$^+$), or electrons (e). Argon radicals (Ar*), which are in a high-energy metastable state, react with the peripheral atoms of the same kind or of different kinds to be returned to a stable state by exciting or ionizing the atoms, whereby a reaction occurs like an avalanche. If oxygen exists in the periphery at that time, oxygen atoms (O) are excited or ionized to be converted into oxygen radicals (O*), oxygen ions (O$^+$), or oxygen (O). The oxygen radicals (O*) react with a material on the surface of a thin film that is to be processed, so that the surface is modified, and the oxygen radicals also react with an organic substance on the surface, so that the organic substance is removed. The plasma treatment is thus performed. Note that radicals of argon gas have the properties of being kept in a metastable state for a longer time than radicals of reactive gas (oxygen gas). Therefore, it is general to use argon gas to generate plasma.

Then, a first oxide semiconductor film (in this embodiment, a first IGZO film) is deposited on the gate insulating layer 102. The first IGZO film is deposited without being exposed to the atmosphere after the plasma treatment, which is advantageous in that dust or moisture is not attached to the interface between the gate insulating layer and the semiconductor film. Here, with the use of an oxide semiconductor target containing In, Ga, and Zn ($In_2O_3:Ga_2O_3:ZnO=1:1:1$), which has a diameter of 8 inches, deposition is performed in an argon atmosphere or an oxygen atmosphere at a distance between the substrate and the target of 170 mm, a pressure of 0.4 Pa, and a direct current (DC) power supply of 0.5 kW. Note that a pulsed direct current (DC) power supply is preferably used to reduce dust and obtain a uniform distribution of film thickness. The thickness of the first IGZO film is 5 nm to 200 nm, and in this embodiment, the thickness of the first IGZO film is 100 nm.

The gate insulating layer and the first IGZO film can be successively deposited by sputtering without being exposed to the atmosphere by changing a gas introduced into a chamber or a target placed in the chamber as appropriate. When the films are successively deposited without being exposed to the atmosphere, impurities can be prevented from entering the films. In the case where the films are successively deposited without being exposed to the atmosphere, a multi-chamber manufacturing apparatus is preferably used.

Next, the channel protective layer 133 is formed to overlap the channel formation region of the first IGZO film. The channel protective layer 133 may also be successively deposited after the gate insulating layer 102 and the first IGZO film without being exposed to the atmosphere. When the stacked layers are successively deposited without being exposed to the atmosphere, the productivity can be improved.

The channel protective layer 133 can be made of an inorganic material (such as silicon oxide, silicon nitride, silicon oxynitride, or silicon nitride oxide) by vapor deposition such as plasma CVD or thermal CVD, or sputtering. The channel protective layer 133 is obtained by processing a shape of a deposited film. Here, an oxide silicon film is formed by sputtering and then etched using a mask formed by photolithography, whereby the channel protective layer 133 is obtained.

Then, a second oxide semiconductor film (in this embodiment, a second IGZO film) is deposited by sputtering over the first IGZO film and the channel protective layer 133. Here, with the use of a target of $In_2O_3:Ga_2O_3:ZnO=1:1:1$, sputtering deposition is performed at a pressure of 0.4 Pa, a power of 500 W, a temperature of room temperature, and an argon gas flow rate of 40 sccm. Although a target of $In_2O_3:Ga_2O_3:ZnO=1:1:1$ is deliberately used, an IGZO film including crystal grains having a diameter of 1 nm to 10 nm is formed in some cases immediately after deposition. It is said that the presence, density, and diameter of crystal grains can be controlled by adjusting the deposition conditions of reactive sputtering as appropriate, such as the composition ratio of a target, the deposition pressure (0.1 Pa to 2.0 Pa), the power (250 W to 3000 W: 8 inches φ), or the temperature (room temperature to 100° C.). The diameter of crystal grains is controlled within a range of 1 nm to 10 nm. The thickness of the second IGZO film is 5 nm to 20 nm. It is needless to say that, if the film includes crystal grains, the diameter of the crystal grains does not exceed the thickness of the film. In this embodiment, the thickness of the second IGZO film is 5 nm.

The first IGZO film and the second IGZO film are deposited under different conditions, so that the oxygen concentration of the first IGZO film is higher than that of the second IGZO film. For example, the flow rate ratio of oxygen gas to argon gas under the deposition conditions of the first IGZO film is higher than that under the deposition conditions of the second IGZO film. Specifically, the second IGZO film is deposited in a rare gas (such as argon or helium) atmosphere (or an atmosphere containing oxygen at 10% or less and an argon gas at 90% or more), and the first IGZO film is deposited in an oxygen atmosphere (or a flow rate of oxygen gas is equal to or more than a flow rate of argon gas). When the first IGZO film contains more oxygen, the conductivity of the first IGZO film can be made lower than that of the second IGZO film. In addition, the off-current of the first IGZO film can be reduced when the first IGZO film contains more oxygen, whereby a thin film transistor having a high on/off ratio can be obtained.

The second IGZO film may be deposited in the same chamber as that used in the preceding reverse sputtering treatment, or may be deposited in a different chamber as long as it can be deposited without being exposed to the atmosphere.

Then, heat treatment is preferably performed at 200° C. to 600° C., and typically, 300° C. to 500° C. Here, heat treatment at 350° C. for one hour is performed in a furnace in a nitrogen atmosphere. This heat treatment involves the rearrangement at the atomic level in the IGZO film. The heat treatment (including light annealing) in this step is important because the strain that inhibits the movement of carriers can be released. Note that there is no particular limitation on the timing of the heat treatment, and the heat treatment may be performed at any time after the deposition of the second IGZO film, for example, after the formation of a pixel electrode.

Figure 7:
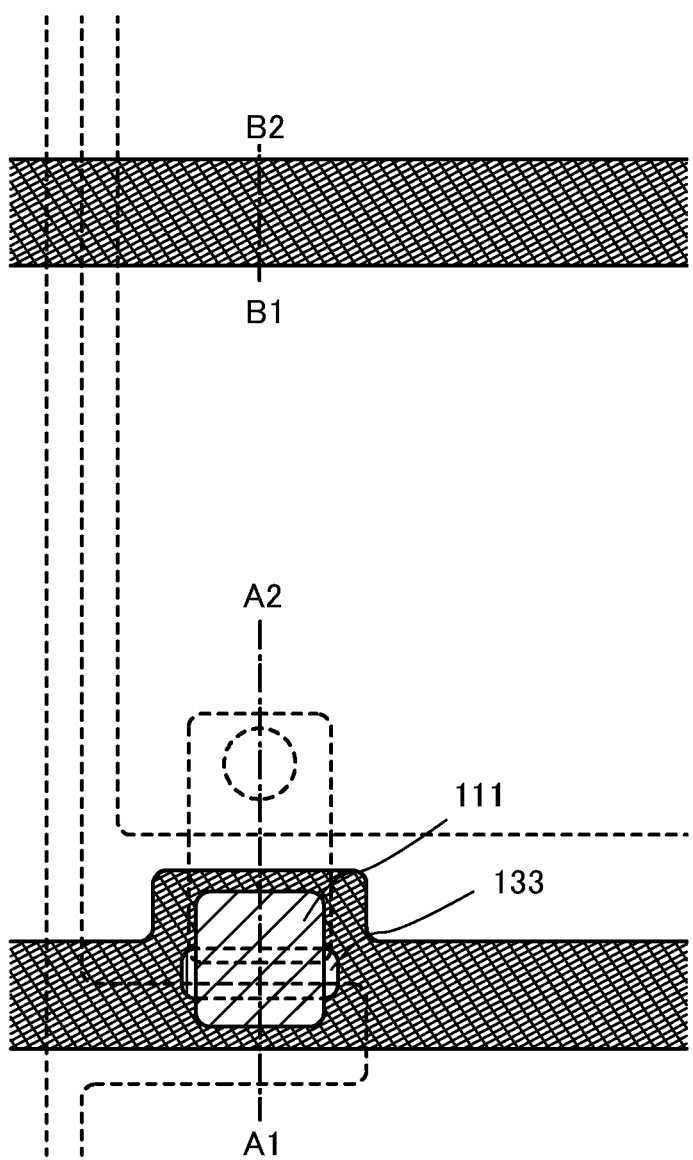
FIG. 7 is a diagram illustrating a method for manufacturing a semiconductor device.

Next, a second photolithography step is performed to form a resist mask, and the first IGZO film and the second IGZO film are etched. Here, unnecessary portions are removed by wet etching using ITO07N (manufactured by KANTO CHEMICAL CO., INC.), thereby forming the semiconductor layer 103 that is an oxygen-excess first IGZO film and an IGZO film 111 that is an oxygen-deficient second IGZO film. Note that this etching step is not limited to wet etching and dry etching may also be performed. A cross-sectional view at this stage is illustrated in FIG. 4B. Note that FIG. 7 is a top view at this stage.

Then, a conductive film 132 made of a metal material is formed over the semiconductor layer 103 and the IGZO film 111 by sputtering or vacuum evaporation. A cross-sectional view at this stage is illustrated in FIG. 4C.

As the material of the conductive film 132, there are an element selected from Al, Cr, Ta, Ti, Mo, and W, an alloy containing any of these elements as its component, an alloy containing a combination of any of these elements, and the like. If heat treatment at 200° C. to 600° C. is performed, the conductive film preferably has heat resistance enough to withstand the heat treatment. Since aluminum alone has the disadvantages of low heat resistance, being easily corroded, and the like, it is used in combination with a conductive material having heat resistance. As the conductive material having heat resistance which is combined with aluminum, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

Here, the conductive film 132 has a single-layer structure of a titanium film. The conductive film 132 may also have a two-layer structure in which a titanium film is stacked on an aluminum film. Alternatively, the conductive film 132 may have a three-layer structure in which a titanium film, an aluminum film containing neodymium (an Al—Nd film), and a titanium film are stacked in order. Further alternatively, the conductive film 132 may have a single-layer structure of an aluminum film containing silicon.

Figures 5A, 5B, 5C:
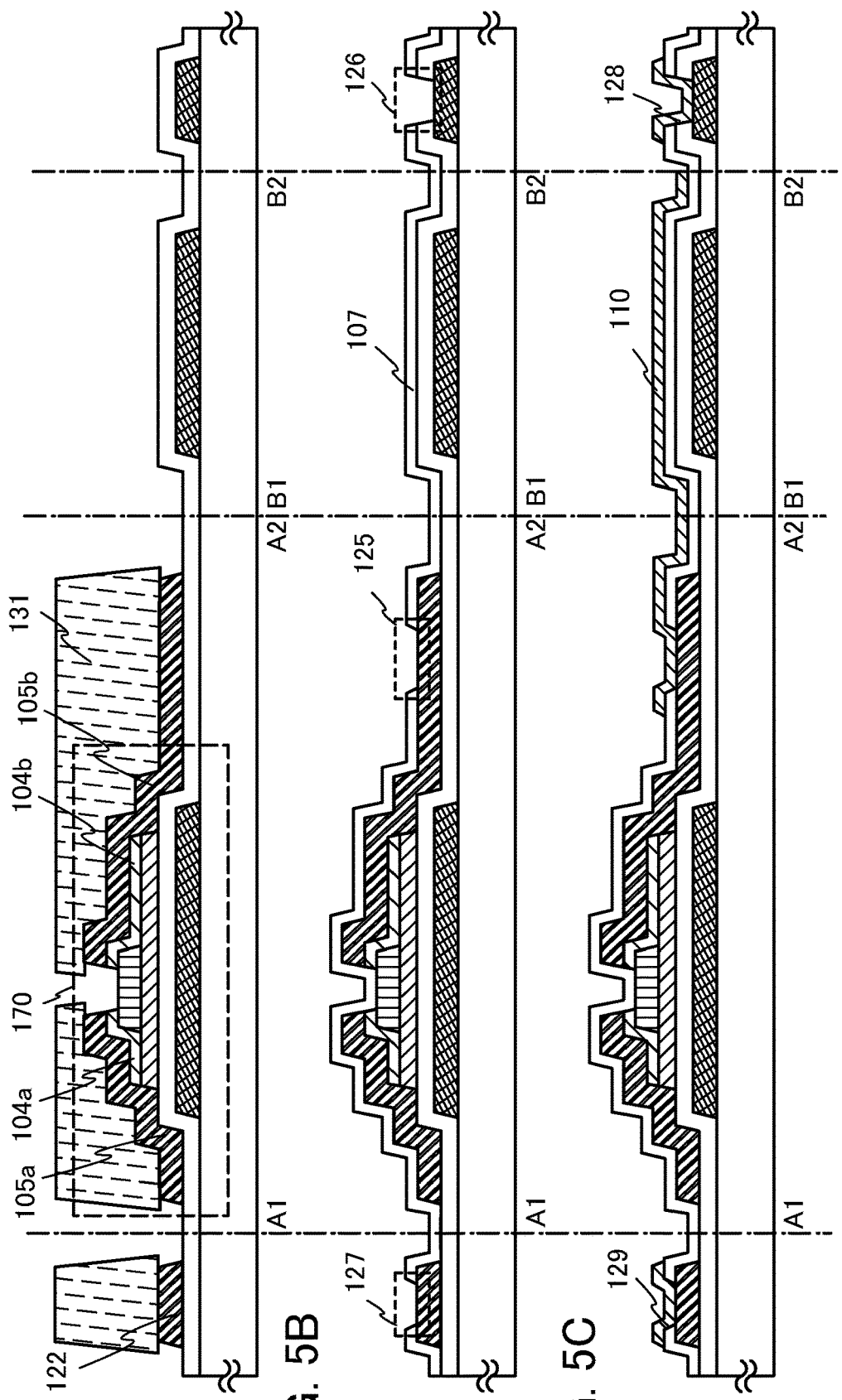
FIGS. 5A to 5C are diagrams illustrating a method for manufacturing a semiconductor device.
Figure 8:
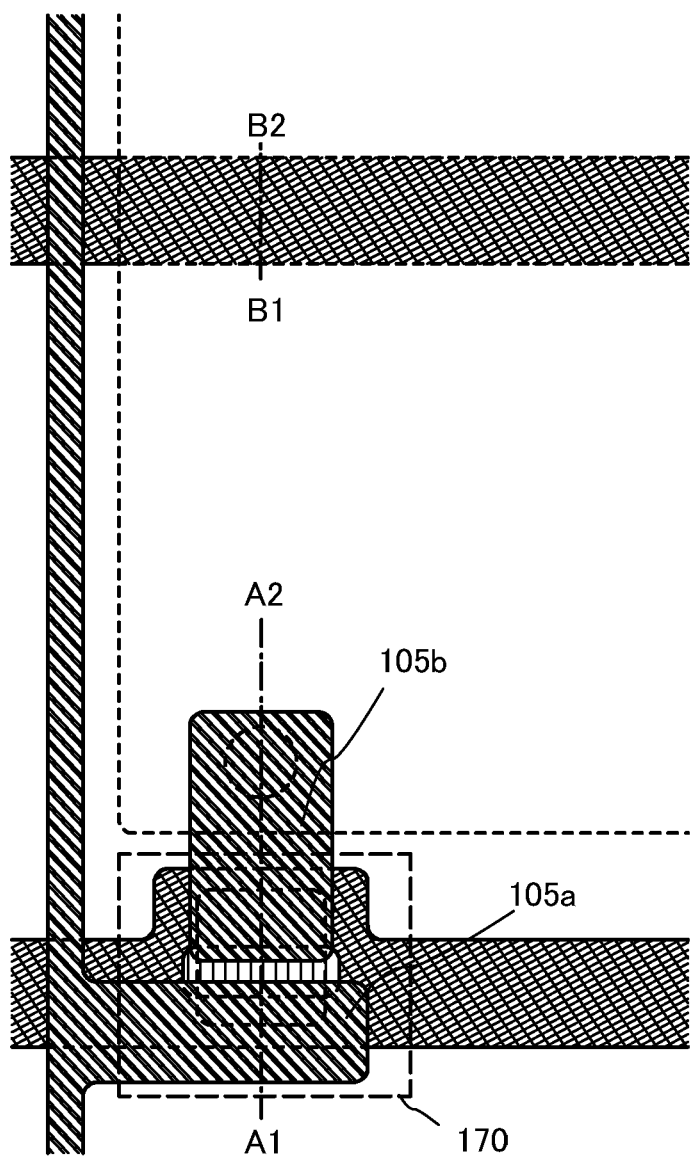
FIG. 8 is a diagram illustrating a method for manufacturing a semiconductor device.

Next, a third photolithography step is performed to form a resist mask 131, and unnecessary portions are removed by etching, thereby forming the source and drain electrode layers 105a and 105b and the source and drain regions 104a and 104b. This etching step is performed by wet etching or dry etching. For example, in the case where an aluminum film or an aluminum alloy film is used as the conductive film 132, wet etching can be performed using a solution in which phosphoric acid, acetic acid, and nitric acid are mixed. Here, with the use of an ammonia hydrogen peroxide mixture (hydrogen peroxide : ammonia : water=5:2:2), the conductive film 132 made of titanium is wet-etched to form the source and drain electrode layers 105a and 105b, and the IGZO film 111 is wet-etched to form the source and drain regions 104a and 104b. In this etching step, the channel protective layer 133 serves as an etching stopper of the semiconductor layer 103; thus, the semiconductor layer 103 is not etched. In FIG. 5A, the source and drain electrode layers 105a and 105b and the source and drain regions 104a and 104b are simultaneously etched using an ammonia hydrogen peroxide mixture; therefore, the edges of the source and drain electrode layers 105a and 105b are aligned with the edges of the source and drain regions 104a and 104b to have a continuous structure. In addition, wet etching allows the layers to be etched isotropically, so that the edges of the source and drain electrode layers 105a and 105b are recessed from the resist mask 131. Through the above steps, the thin film transistor 170 including the IGZO semiconductor layer 103 as a channel formation region and having the channel protective layer 133 over the channel formation region can be manufactured. A cross-sectional view at this stage is illustrated in FIG. 5A. Note that FIG. 8 is a top view at this stage.

Since the channel protective layer 133 is provided over the channel formation region of the semiconductor layer 103, the channel formation region of the semiconductor layer 103 can be prevented from being damaged in the process (plasma generated in etching, reduction in thickness due to an etchant, oxidization, or the like can be prevented). Accordingly, the reliability of a thin film transistor 170 can be improved.

In the third photolithography step, a second terminal 122 that is made of the same material as the source and drain electrode layers 105a and 105b remains in the terminal portion. Note that the second terminal 122 is electrically connected to a source wiring (a source wiring including the source and drain electrode layers 105a and 105b).

If using a resist mask having a plurality of regions with different thicknesses (typically, two kinds of thicknesses) formed using a multi-tone mask, the number of resist masks can be reduced, resulting in simplified process and lower cost.

Next, the resist mask 131 is removed and the protective insulating layer 107 is formed to cover the thin film transistor 170. The protective insulating layer 107 can be formed of a silicon nitride film, a silicon oxide film, a silicon oxynitride film, an aluminum oxide film, a tantalum oxide film, or the like which is obtained by sputtering.

Then, a fourth photolithography step is performed to form a resist mask, and the protective insulating layer 107 is etched to form a contact hole 125 reaching the source electrode layer 105a or drain electrode layer 105b. In addition, a contact hole 127 reaching the second terminal 122 is also formed in the same etching step. In order to reduce the number of masks, the gate insulating layer is preferably etched using the same resist mask so that a contact hole 126 reaching the gate electrode is formed using the same resist mask. A cross-sectional view at this stage is illustrated in FIG. 5B.

Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by sputtering, vacuum evaporation, or the like. Such a material is etched with a hydrochloric acid-based solution. However, since a residue is easily generated particularly in etching ITO, indium oxide-zinc oxide alloy ($In_2O_3$—ZnO) may be used to improve etching processability.

Next, a fifth photolithography step is performed to form a resist mask, and unnecessary portions are removed by etching, thereby forming the pixel electrode layer 110.

In the fifth photolithography step, a storage capacitor is formed between the capacitor wiring 108 and the pixel electrode layer 110 by using the gate insulating layer 102 and the protective insulating layer 107 in the capacitor portion as a dielectric.

Furthermore, in the fifth photolithography step, the first terminal and the second terminal are covered with the resist mask so that transparent conductive films 128 and 129 remain in the terminal portion. The transparent conductive films 128 and 129 serve as an electrode or a wiring connected to an FPC. The transparent conductive film 129 formed over the second terminal 122 is a connecting terminal electrode serving as an input terminal of a source wiring.

Figure 9:
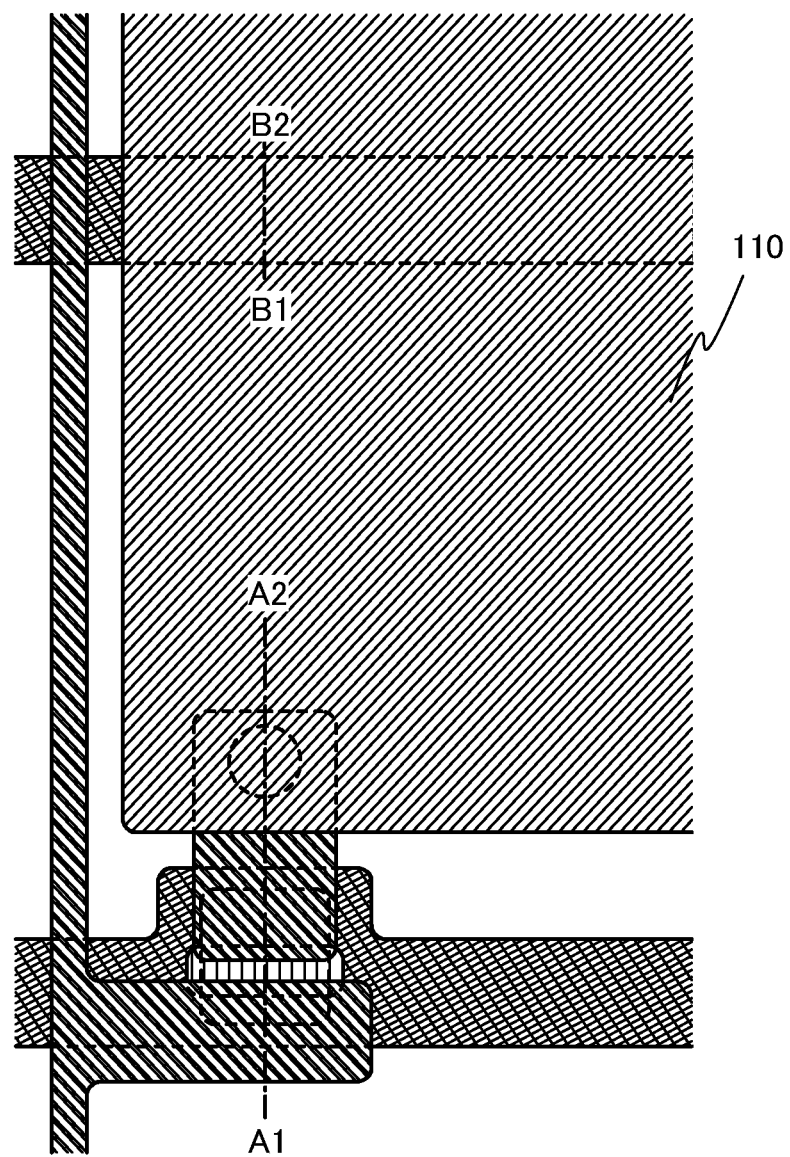
FIG. 9 is a diagram illustrating a semiconductor device.

Then, the resist mask is removed. A cross-sectional view at this stage is illustrated in FIG. 5C. Note that FIG. 9 is a top view at this stage.

Figure 10A:
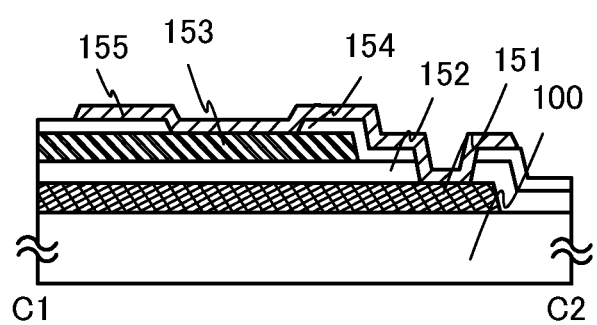
FIGS. 10A to 10D are diagrams illustrating a semiconductor device.
Figure 10B:
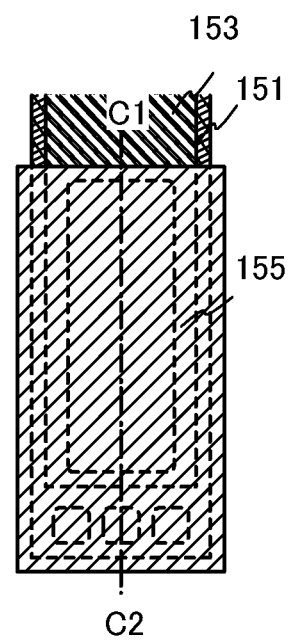

FIGS. 10A and 10B are respectively a cross-sectional view and a top view of a gate wiring terminal portion at this stage. FIG. 10A is a cross-sectional view taken along line C1-C2 of FIG. 10B. In FIG. 10A, a transparent conductive film 155 formed over the protective insulating film 154 is a connecting terminal electrode serving as an input terminal. Furthermore, in the terminal portion of FIG. 10A, a first terminal 151 made of the same material as the gate wiring and a connection electrode layer 153 made of the same material as the source wiring overlap each other with a gate insulating layer 152 interposed therebetween, and are electrically connected to each other through the transparent conductive film 155. Note that a part of FIG. 5C where the transparent conductive film 128 is in contact with the first terminal 121 corresponds to a part of FIG. 10A where the transparent conductive film 155 is in contact with the first terminal 151.

Figure 10C:
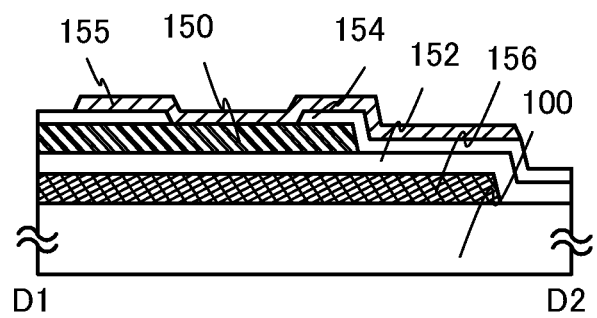
Figure 10D:
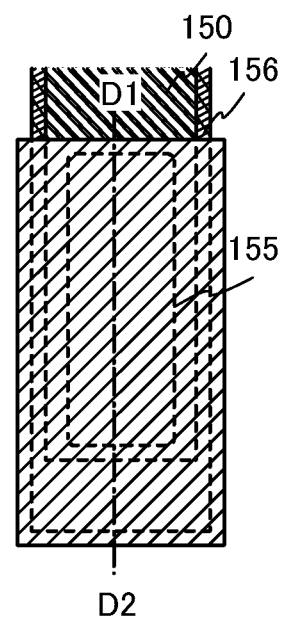

FIGS. 10C and 10D are respectively a cross-sectional view and a top view of a source wiring terminal portion which is different from that illustrated in FIG. 5C. FIG. 10C is a cross-sectional view taken along line D1-D2 of FIG. 10D. In FIG. 10C, the transparent conductive film 155 formed over the protective insulating film 154 is a connecting terminal electrode serving as an input terminal. Furthermore, in the terminal portion of FIG. 10C, an electrode layer 156 made of the same material as the gate wiring is formed under a second terminal 150 electrically connected to the source wiring and overlaps the second terminal 150 with the gate insulating layer 152 interposed therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. The second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Through these five photolithography steps, a pixel thin film transistor portion including the thin film transistor 170 which is a bottom-gate n-channel thin film transistor, and the storage capacitor can be completed using the five photomasks. When these pixel thin film transistor portion and storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is fixed to a predetermined potential such as GND or 0 V.

Figure 11:
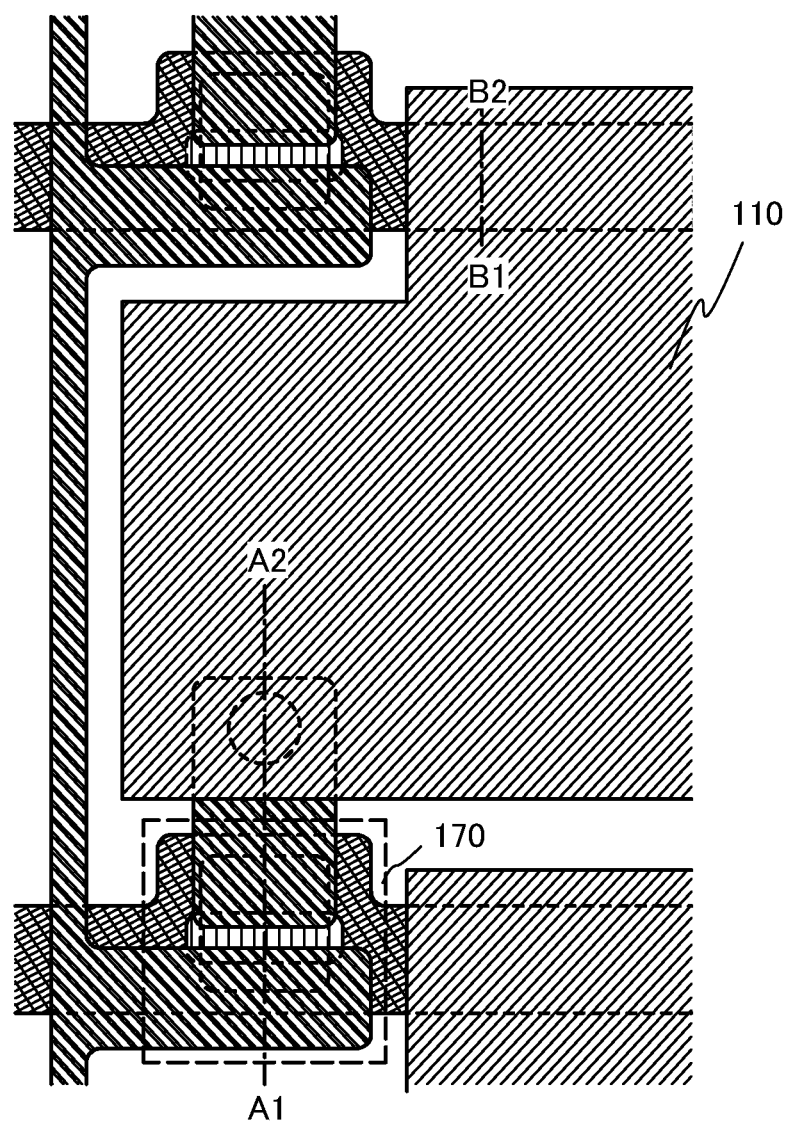
FIG. 11 is a diagram illustrating a semiconductor device.

One embodiment of the present invention is not limited to the pixel structure of FIG. 9, and an example of the top view different from FIG. 9 is illustrated in FIG. 11. FIG. 11 illustrates an example in which a capacitor wiring is not provided and a pixel electrode layer overlaps a gate wiring of an adjacent pixel with a protective insulating film and a gate insulating layer interposed therebetween to form a storage capacitor. In that case, the capacitor wiring and the third terminal connected to the capacitor wiring can be omitted. Note that in FIG. 11, portions similar to those in FIG. 9 are denoted by the same reference numerals.

In an active matrix liquid crystal display device, pixel electrodes arranged in a matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is 1.5 or 2 times as long as usual to improve the moving-image characteristics.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor of this embodiment includes an IGZO semiconductor layer in a channel formation region and has good dynamic characteristics. Accordingly, these driving methods can be applied in combination to the n-channel transistor of this embodiment.

In the case of manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in the case of manufacturing a light-emitting display device, a power supply line is provided in addition to a source wiring and a gate wiring. Accordingly, a terminal portion is provided with a fifth terminal electrically connected to the power supply line.

If a gate electrode layer, a gate insulating layer, a semiconductor layer (an oxygen-excess oxide semiconductor layer containing In, Ga, and Zn), and source and drain electrode layers are stacked without providing source and drain regions (oxygen-deficient oxide semiconductor layers containing In, Ga, and Zn), the distance between the gate electrode layer and the source and drain electrode layers is reduced, thereby increasing the parasitic capacitance therebetween. In addition, the parasitic capacitance is further increased by a reduction in the thickness of the semiconductor layer. In this embodiment, a thin film transistor has a stacked structure in which a gate electrode layer, a gate insulating layer, a semiconductor layer, source and drain electrode regions, and source and drain electrode layers are stacked, parasitic capacitance can be suppressed even when the thickness of the semiconductor layer is small.

According to this embodiment, a thin film transistor having a small amount of photocurrent, low parasitic capacitance, a high on-off ratio, and good dynamic characteristics can be manufactured. Thus, a semiconductor device including a thin film transistor having high electrical properties and high reliability can be provided.

Embodiment 7

Figure 31A:
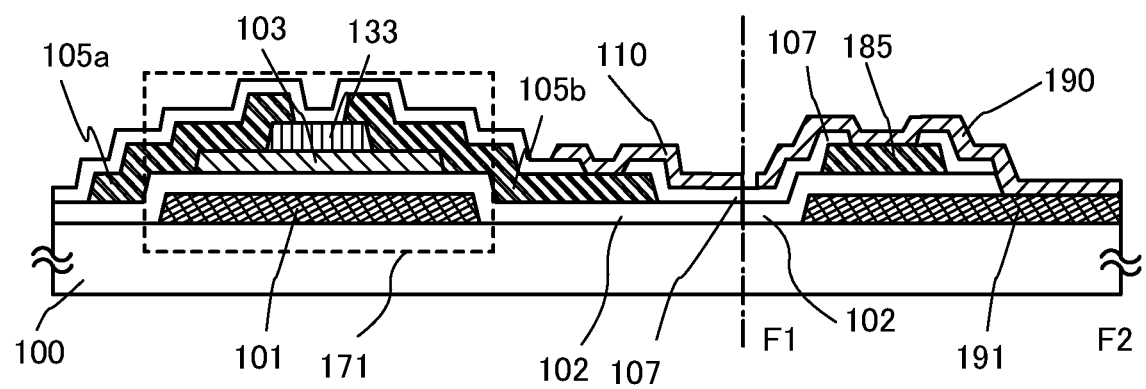
FIGS. 31A and 31B are diagrams illustrating a semiconductor device.
Figure 31B:
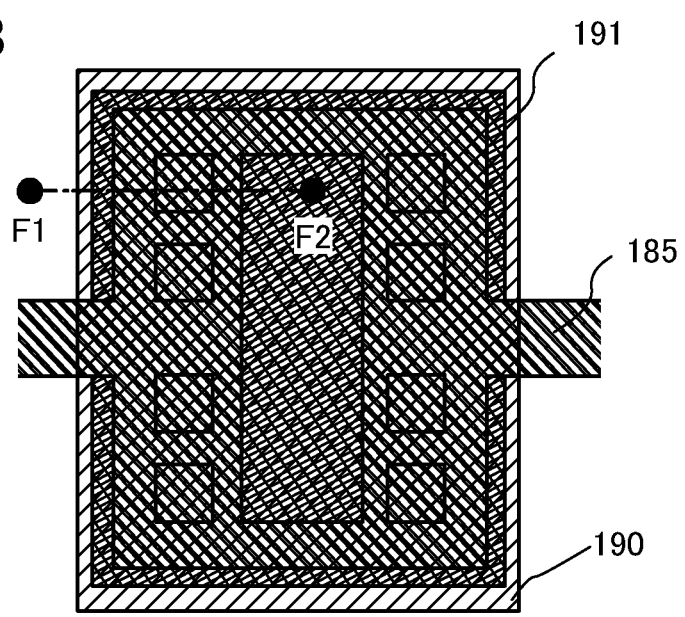

In this embodiment, another example of the display device shown in Embodiment 3, which includes a thin film transistor in which source and drain electrode layers are in contact with a semiconductor layer, will be illustrated in FIGS. 31A and 31B.

FIG. 31A is a cross-sectional view of a semiconductor device in which a thin film transistor and a common connection portion (a pad portion) are manufactured over the same substrate. A thin film transistor 171 illustrated in FIG. 31A is an inverted staggered thin film transistor having a channel protective layer. The channel protective layer 133 is provided over the channel formation region of the semiconductor layer 103, and the source and drain electrode layers 105a and 105b are provided over the semiconductor layer 103 and the channel protective layer 133 so as to be in contact with the semiconductor layer 103.

In the thin film transistor 171, a contact region between the semiconductor layer 103 and the source and drain electrode layers 105a and 105b is preferably modified by plasma treatment. In this embodiment, before forming a conductive film serving as the source and drain electrode layers, an oxide semiconductor layer (an IGZO semiconductor layer in this embodiment) is subjected to plasma treatment.

The plasma treatment is performed using argon gas, hydrogen gas, or a mixture gas of argon and hydrogen. Oxygen gas may be added to these gases. Instead of argon gas, other rare gases may be used.

Figure 32:
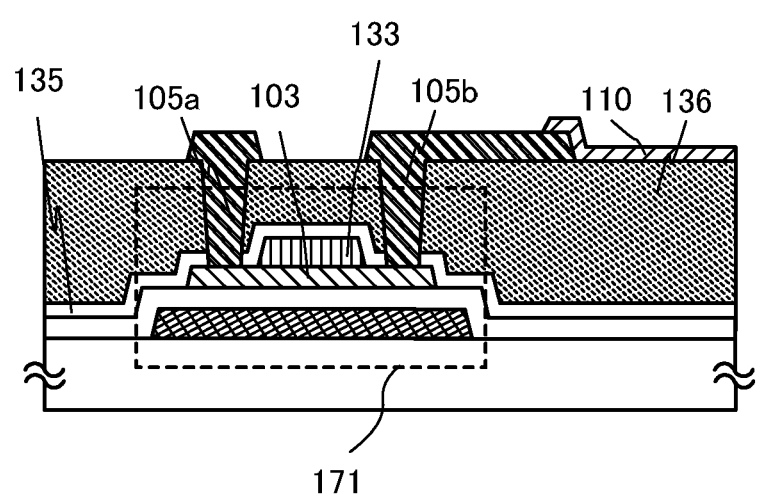
FIG. 32 is a diagram illustrating a semiconductor device.

As illustrated in FIG. 32, an insulating layer 135 and an insulating layer 136 may be formed as interlayer insulating layers over the semiconductor layer 103. The source and drain electrode layers 105a and 105b are in contact with and electrically connected to the semiconductor layer 103 through contact holes formed in the insulating layer 135 and the insulating layer 136.

Note that in FIG. 32, a silicon oxide layer is formed as the gate insulating layer 102 and the channel protective layer 133, an IGZO oxygen-excess semiconductor layer is formed as the semiconductor layer 103, and a silicon nitride layer is formed as the insulating layer 135, each of which is formed by sputtering.

Also in FIG. 32, the semiconductor layer 103 is preferably subjected to plasma treatment before the source and drain electrode layers 105a and 105b are formed. The plasma treatment may be performed after the channel protective layer 133 is formed over the semiconductor layer 103. Alternatively, after the contact holes are formed in the insulating layer 135 and the insulating layer 136, the plasma treatment may be performed on the semiconductor layer 103 which is exposed at the bottom of each of the contact holes.

A conductive layer is formed in contact with the semiconductor layer 103 modified by the plasma treatment, thereby forming the source and drain electrode layers 105a and 105b. Accordingly, the contact resistance between the semiconductor layer 103 and the source and drain electrode layers 105a and 105b can be reduced.

Through the above process, a highly reliable display device as a semiconductor device can be manufactured.

This embodiment can be implemented in appropriate combination with the structures described in the other embodiments.

Embodiment 8

In this embodiment, an example of a display device which is one example of a semiconductor device of the present invention will be described. In the display device, at least a part of a driver circuit and a thin film transistor to be disposed in a pixel portion are formed over one substrate.

The thin film transistor to be disposed in the pixel portion is formed according to Embodiment 6 or 7. Further, the thin film transistor described in Embodiment 6 or 7 is an n-channel TFT, and thus a part of a driver circuit that can include an n-channel TFT among driver circuits is formed over the same substrate as the thin film transistor in the pixel portion.

Figure 13A:
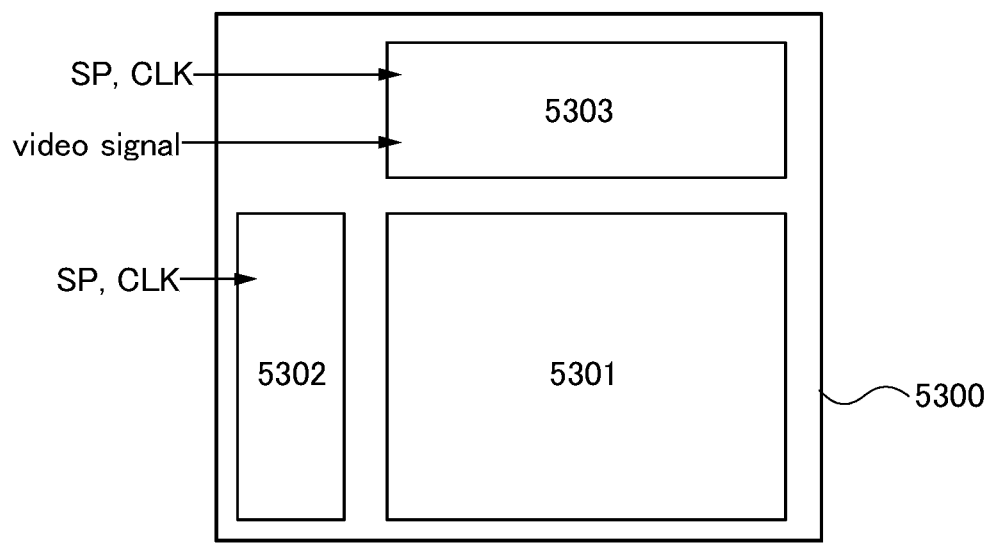
FIGS. 13A and 13B are block diagrams of a semiconductor device.

FIG. 13A illustrates an example of a block diagram of an active matrix liquid crystal display device which is an example of a semiconductor device of the present invention. The display device illustrated in FIG. 13A includes, over a substrate 5300, a pixel portion 5301 including a plurality of pixels each provided with a display element; a scan line driver circuit 5302 for selecting a pixel; and a signal line driver circuit 5303 for controlling a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in a matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

The thin film transistor described in Embodiment 6 or 7 is an n-channel TFT, and a signal line driver circuit including an n-channel TFT will be described with reference to FIG. 14.

Figure 14:
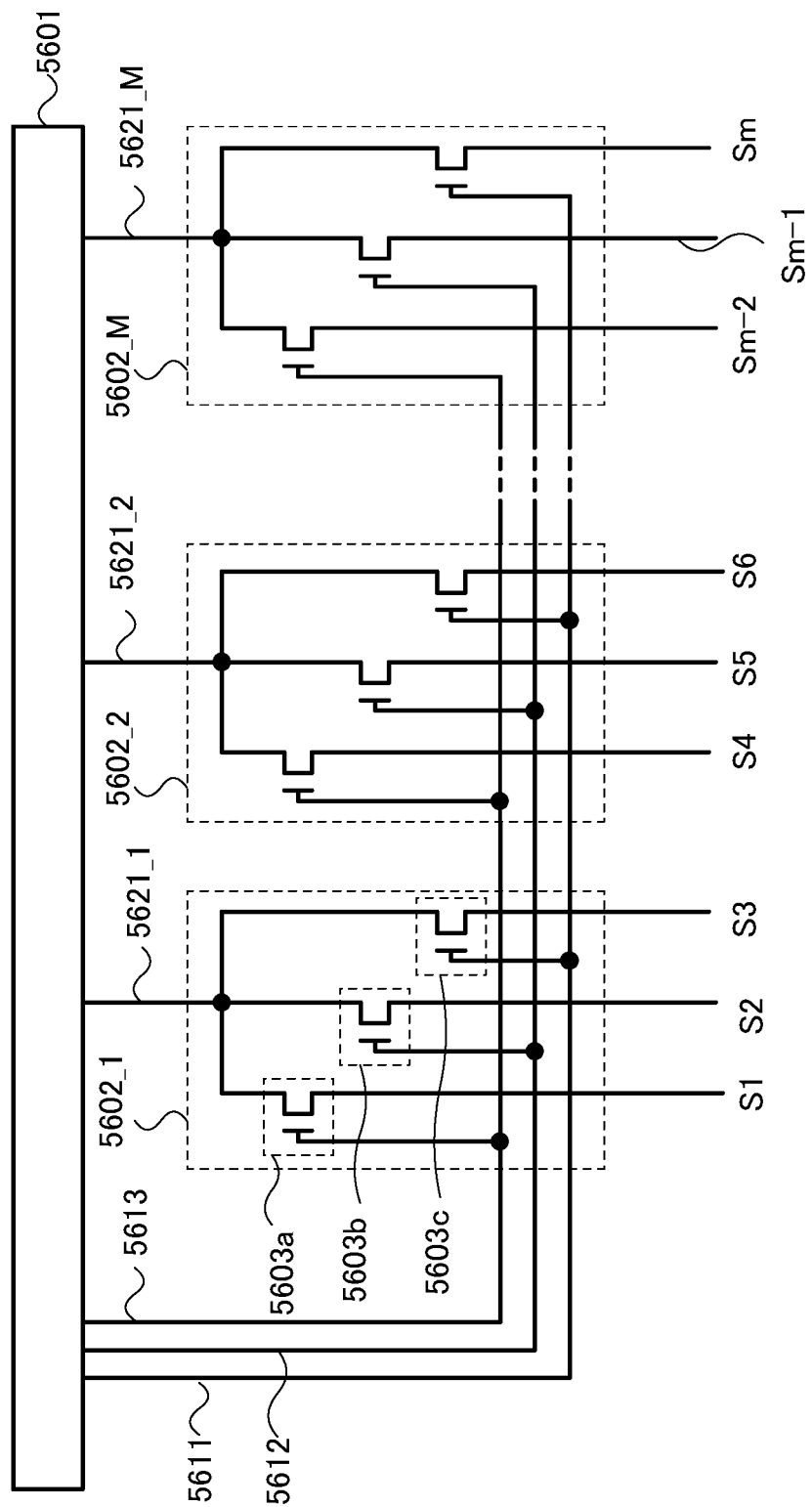
FIG. 14 is a diagram illustrating a configuration of a signal line driver circuit.

The signal line driver circuit illustrated in FIG. 14 includes a driver IC 5601, switch groups 5602-1 to 5602-M, a first wiring 5611, a second wiring 5612, a third wiring 5613, and wirings 5621-1 to 5621-M. Each of the switch groups 5602-1 to 5602-M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621-1 to 5621-M. Each of the switch groups 5602-1 to 5602-M is connected to the first wiring 5611, the second wiring 5612, and the third wiring 5613, and the switch groups 5602-1 to 5602-M are connected to the wirings 5621-1 to 5621-M, respectively. Each of the wirings 5621-1 to 5621-M is connected to three signal lines via the first thin film transistor 5603a, the second thin film transistor 5603b, and the third thin film transistor 5603c. For example, the wiring 5621-J of the J-th column (one of the wirings 5621-1 to 5621-M) is connected to a signal line Sj−1, a signal line Sj, and a signal line Sj+1 via the first thin film transistor 5603a, the second thin film transistor 5603b, and the third thin film transistor 5603c which are included in the switch group 5602-J.

A signal is input to each of the first wiring 5611, the second wiring 5612, and the third wiring 5613.

Note that the driver IC 5601 is preferably formed over a single crystal substrate. Further, the switch groups 5602-1 to 5602-M are preferably formed over the same substrate as the pixel portion. Therefore, the driver IC 5601 is preferably connected to the switch groups 5602-1 to 5602-M through an FPC or the like.

Figure 15:
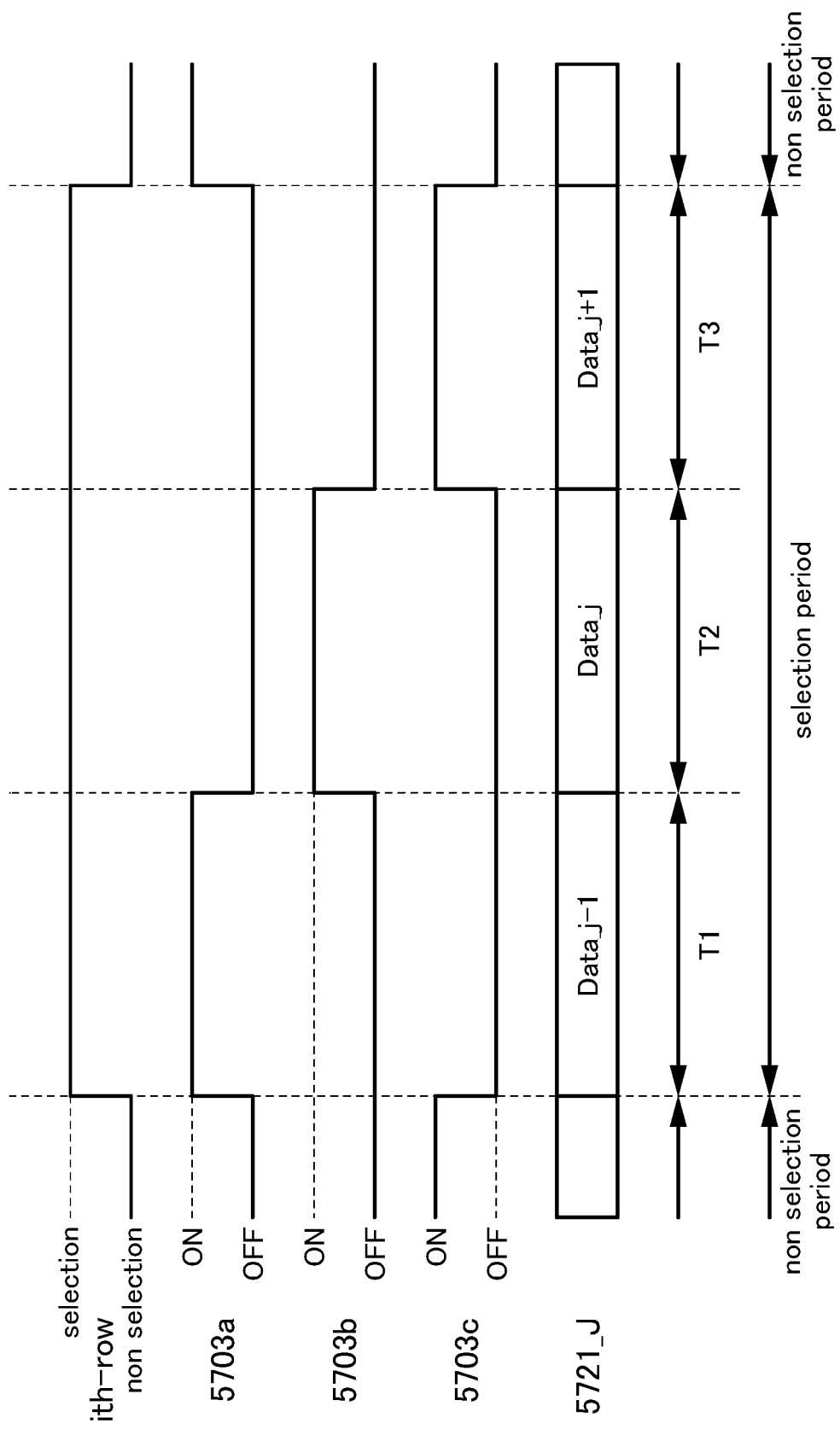
FIG. 15 is a timing chart illustrating operation of a signal line driver circuit.

Next, operation of the signal line driver circuit illustrated in FIG. 14 will be described with reference to a timing chart of FIG. 15. The timing chart of FIG. 15 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 14 operates in a manner similar to that of FIG. 15 even when a scan line of another row is selected.

Note that the timing chart of FIG. 15 illustrates a case where the wiring 5621-J of the J-th column is connected to the signal line Sj−1, the signal line Sj, and the signal line Sj+1 via the first thin film transistor 5603a, the second thin film transistor 5603b, and the third thin film transistor 5603c.

The timing chart of FIG. 15 shows the timing at which the scan line Gi of the i-th row is selected, timing 5703a at which the first thin film transistor 5603a is turned on/off, timing 5703b at which the second thin film transistor 5603b is turned on/off, timing 5703c at which the third thin film transistor 5603c is turned on/off, and a signal 5721-J input to the wiring 5621-J of the J-th column.

In the first sub-selection period T1, the second sub-selection period T2, and the third sub-selection period T3, different video signals are input to the wirings 5621-1 to 5621-M. For example, a video signal input to the wiring 5621-J in the first sub-selection period T1 is input to the signal line Sj−1, a video signal input to the wiring 5621-J in the second sub-selection period T2 is input to the signal line Sj, and a video signal input to the wiring 5621-J in the third sub-selection period T3 is input to the signal line Sj+1. The video signals input to the wiring 5621-J in the first sub-selection period T1, the second sub-selection period T2, and the third sub-selection period T3 are denoted by Data-j−1, Data-j, and Data-j+1, respectively.

As illustrated in FIG. 15, in the first sub-selection period T1, the first thin film transistor 5603a is turned on, and the second thin film transistor 5603b and the third thin film transistor 5603c are turned off. At this time, Data-j−1 input to the wiring 5621-J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 5621-J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data-j+1 input to the wiring 5621-J is input to the signal line Sj+1 via the third thin film transistor 5603c.

As described above, in the signal line driver circuit of FIG. 14, by dividing one gate selection period into three, video signals can be input to three signal lines from one wiring 5621 in one gate selection period. Therefore, in the signal line driver circuit of FIG. 14, the number of connections between the substrate provided with the driver IC 5601 and the substrate provided with the pixel portion can be reduced to approximately one third of the number of signal lines. When the number of connections is reduced to approximately one third of the number of the signal lines, the reliability, yield, and the like of the signal line driver circuit of FIG. 14 can be improved.

Note that there are no particular limitations on the arrangement, number, driving method, and the like of the thin film transistors, as long as one gate selection period is divided into a plurality of sub-selection periods and video signals are input to a plurality of signal lines from one wiring in the respective sub-selection periods as illustrated in FIG. 14.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 16:
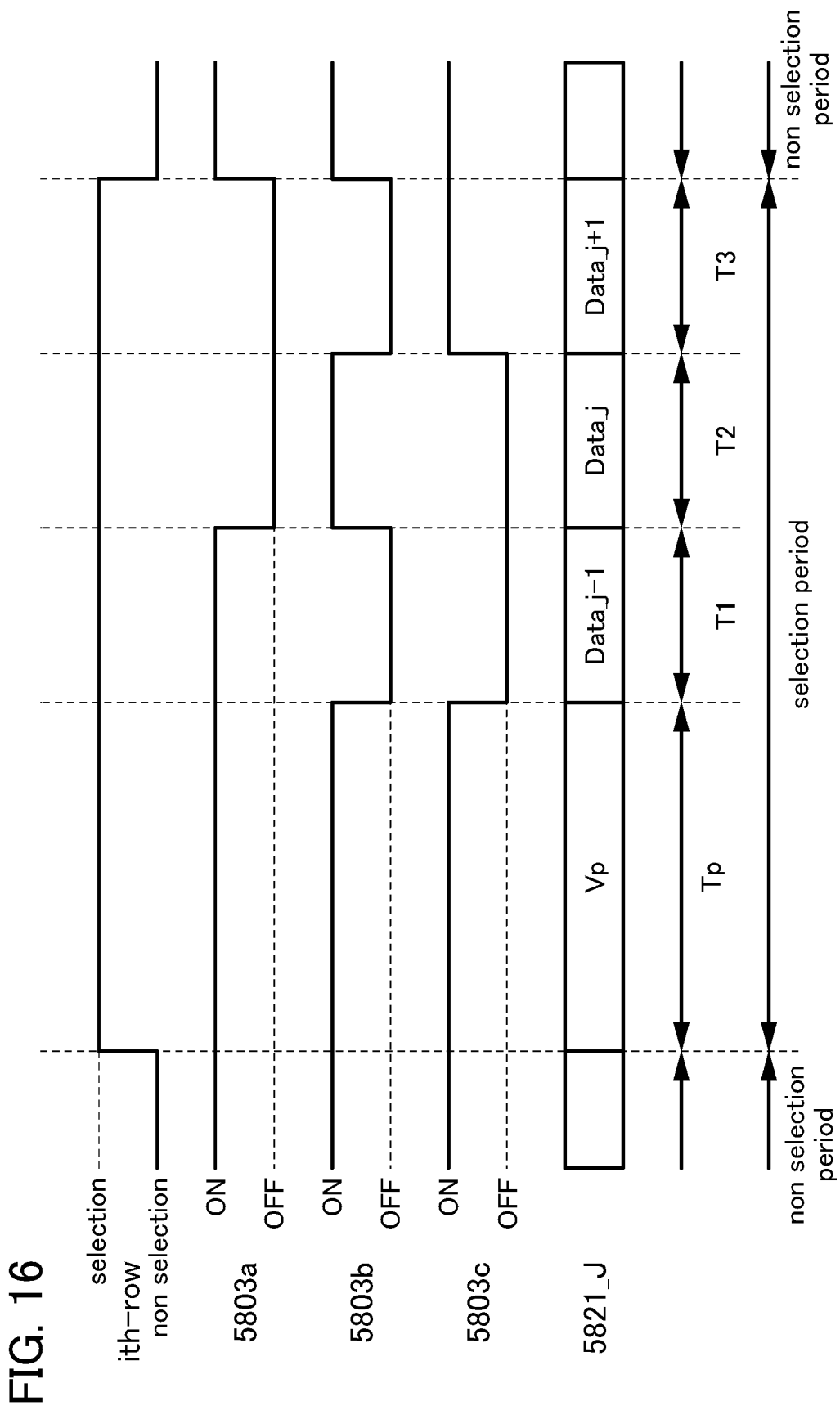
FIG. 16 is a timing chart illustrating operation of a signal line driver circuit.

As another example, one selection period may be divided into a precharge period Tp, the first sub-selection period T1, the second sub-selection period T2, and the third sub-selection period T3 as illustrated in a timing chart of FIG. 16. The timing chart of FIG. 16 illustrates the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821-J input to the wiring 5621-J of the J-th column. As illustrated in FIG. 16, the first thin film transistor 5603a, the second thin film transistor 5603b, and the third thin film transistor 5603c are tuned on in the precharge period Tp. At this time, precharge voltage Vp input to the wiring 5621-J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data-j−1 input to the wiring 5621-J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 56214 is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data-j+1 input to the wiring 56214 is input to the signal line Sj+1 via the third thin film transistor 5603c.

As described above, in the signal line driver circuit of FIG. 14 to which the timing chart of FIG. 16 is applied, the video signal can be written to the pixel at high speed because the signal line can be precharged by providing a precharge selection period before a sub-selection period. Note that portions of FIG. 16 which are similar to those of FIG. 15 are denoted by common reference numerals and detailed description of like portions and portions having a similar function is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for a part of the scan line driver circuit will be described with reference to FIG. 17 and FIG. 18.

Figure 17:
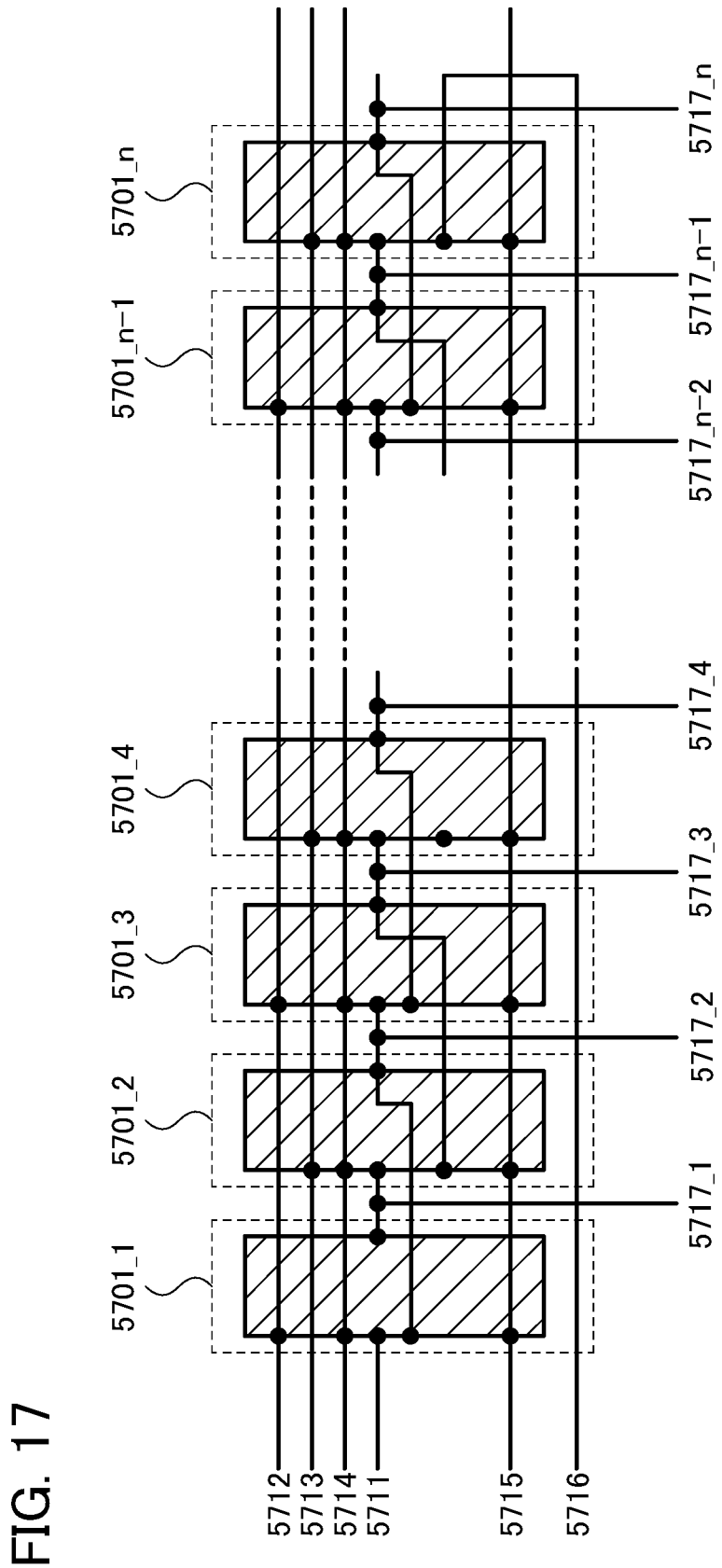
FIG. 17 is a diagram illustrating a configuration of a shift register.

FIG. 17 illustrates a circuit configuration of the shift register. The shift register illustrated in FIG. 17 includes a plurality of flip-flops (flip-flops 5701-1 to 5701-*n*). The shift register operates with the input of a first clock signal, a second clock signal, a start pulse signal, and a reset signal.

The connection relationship of the shift register of FIG. 17 will be described. In the i-th stage flip-flop 5701-*i* (one of the flip-flops 5701-1 to 5701-*n*) in the shift register of FIG. 17, a first wiring 5501 illustrated in FIG. 18 is connected to a seventh wiring 5717-*i*−1; a second wiring 5502 illustrated in FIG. 18 is connected to a seventh wiring 5717-*i*+1; a third wiring 5503 illustrated in FIG. 18 is connected to a seventh wiring 5717-*i*; and a sixth wiring 5506 illustrated in FIG. 18 is connected to a fifth wiring 5715.

Figure 18:
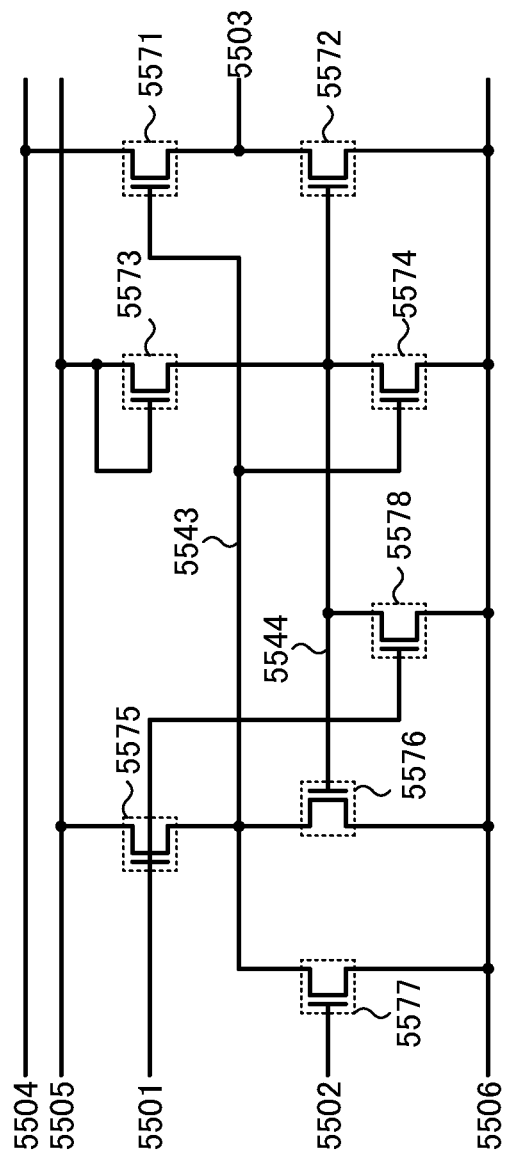
FIG. 18 is a diagram illustrating a connection structure of a flip flop illustrated in FIG. 17.

Further, a fourth wiring 5504 illustrated in FIG. 18 is connected to a second wiring 5712 in flip-flops of odd-numbered stages, and is connected to a third wiring 5713 in flip-flops of even-numbered stages. A fifth wiring 5505 illustrated in FIG. 18 is connected to a fourth wiring 5714.

Note that the first wiring 5501 of the first stage flip-flop 5701-1 illustrated in FIG. 18 is connected to a first wiring 5711. Moreover, the second wiring 5502 of the n-th stage flip-flop 5701-*n* illustrated in FIG. 18 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 18 illustrates details of the flip-flop illustrated in FIG. 17. A flip-flop illustrated in FIG. 18 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 18 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505 and a second electrode of the third thin film transistor is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only n-channel TFTs described in Embodiment 6. Since the n-channel TFT described in Embodiment 6 has a high mobility, the driving frequency of a driver circuit can be increased. In addition, in the n-channel TFT described in Embodiment 6, since parasitic capacitance is reduced by the source or drain region that is an oxide-deficient oxide semiconductor layer containing indium, gallium, and zinc, high frequency characteristics (referred to as F characteristics) can be obtained. For example, a scan line driver circuit using the n-channel TFT described in Embodiment 6 can operate at high speed, and thus a frame frequency can be increased and insertion of black images can be realized.

In addition, when the channel width of the transistor in the scan line driver circuit is increased or a plurality of scan line driver circuits are provided, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, an increase in frame frequency can be realized.

Figure 13B:
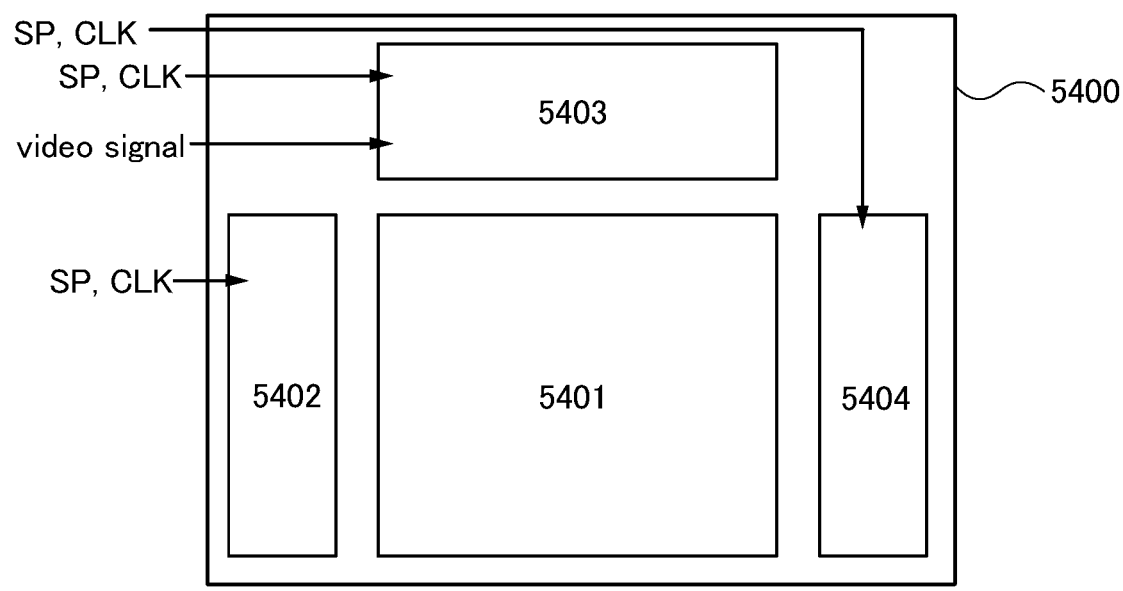

Further, when an active matrix light-emitting display device which is an example of a semiconductor device of the present invention is manufactured, a plurality of thin film transistors are arranged in at least one pixel, and thus a plurality of scan line driver circuits are preferably arranged. FIG. 13B is an example of a block diagram of an active matrix light-emitting display device.

The light-emitting display device illustrated in FIG. 13B includes, over a substrate 5400, a pixel portion 5401 having a plurality of pixels each provided with a display element, a first scan line driver circuit 5402 and a second scan line driver circuit 5404 for selecting a pixel, and a signal line driver circuit 5403 for controlling input of a video signal to the selected pixel.

When the video signal input to a pixel of the light-emitting display device illustrated in FIG. 13B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

In the light-emitting display device illustrated in FIG. 13B, in a case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

Also in the light-emitting display device, a part of a driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 6 or 7.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in Embodiment 6 or 7 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device as a semiconductor device can be manufactured.

This embodiment can be implemented in appropriate combination with the structures described in the other embodiments.

Embodiment 9

When a thin film transistor of one embodiment of the present invention is manufactured and used for a pixel portion and further for a driver circuit, a semiconductor device having a display function (also referred to as a display device) can be manufactured. Furthermore, when part or whole of a driver circuit using a thin film transistor of one embodiment of the present invention is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

Figure 21A:
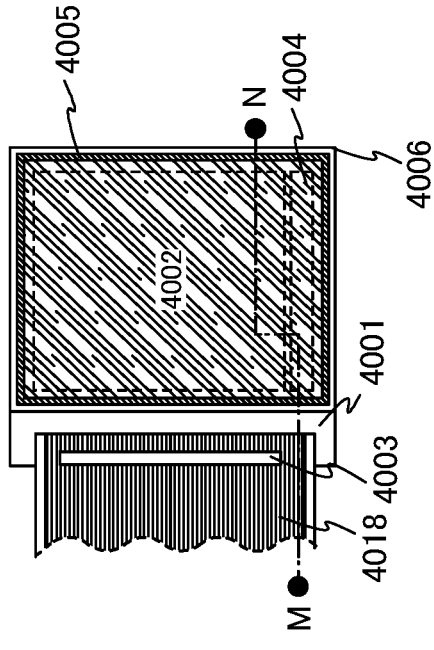
FIGS. 21A to 21C are diagrams illustrating a semiconductor device.
Figure 21B:
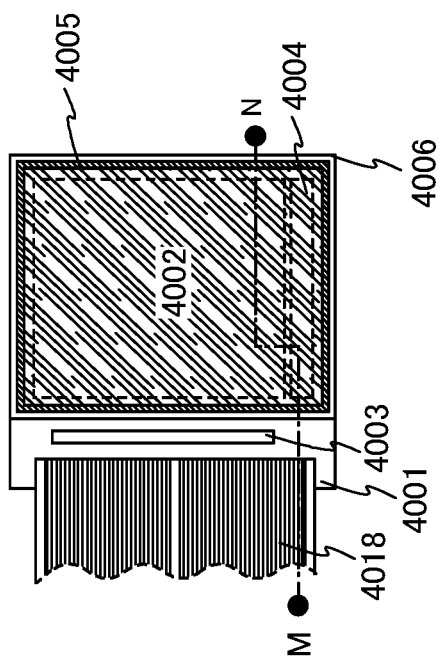
Figure 21C:
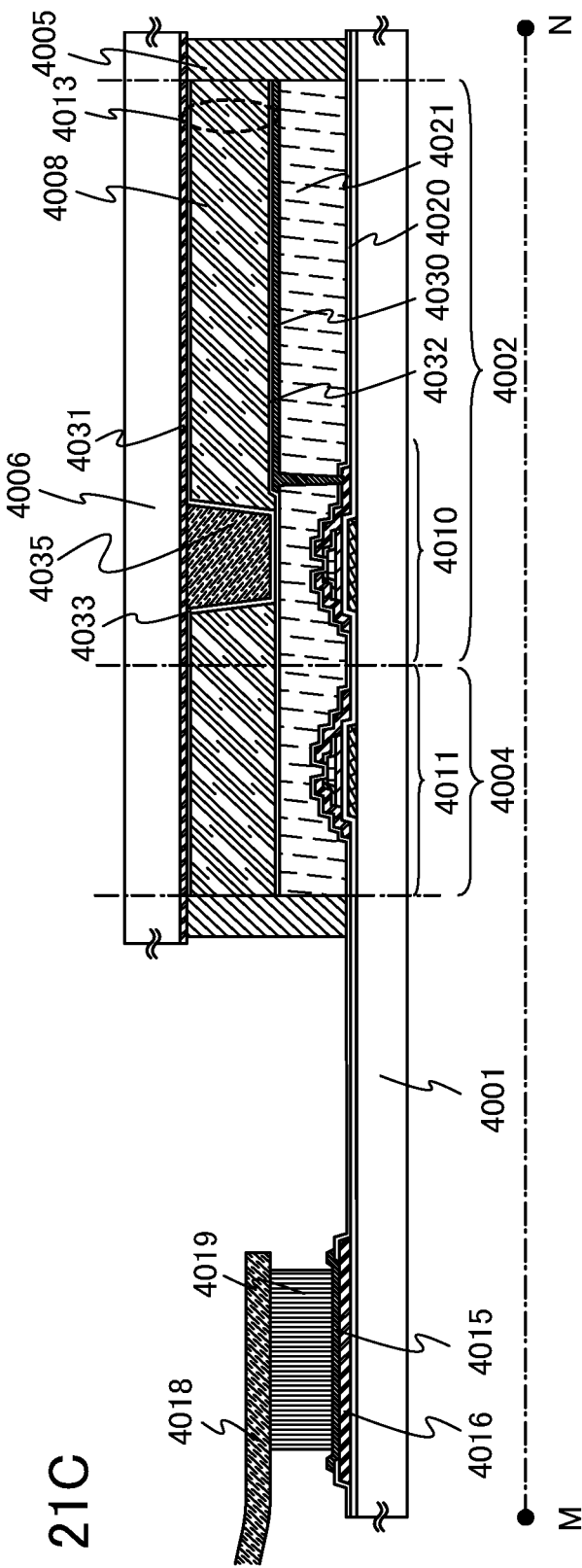

In this embodiment, the appearance and a cross section of a liquid crystal display panel, which is one embodiment of the semiconductor device of the present invention, will be described with reference to FIGS. 21A to 21C. FIGS. 21A and 21B are top views of a panel in which thin film transistors 4010 and 4011, and a liquid crystal element 4013 are sealed between a first substrate 4001 and a second substrate 4006 with a sealant 4005. FIG. 21C is a cross-sectional view taken along line M-N of FIGS. 21A and 21B.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 21A illustrates an example of mounting the signal line driver circuit 4003 by COG, and FIG. 21B illustrates an example of mounting the signal line driver circuit 4003 by TAB.

The pixel portion 4002 and the scanning line driver circuit 4004 provided over the first substrate 4001 each include a plurality of thin film transistors. FIG. 21C illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

As the thin film transistors 4010 and 4011, the highly reliable thin film transistor shown in Embodiment 6, which includes an oxygen-excess oxide semiconductor layer as a channel formation region and an oxygen-deficient oxide semiconductor layer as source and drain regions may be employed. Alternatively, the thin film transistor shown in Embodiment 7 may be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010. With the use of the common connection portion show in any of Embodiments 1 to 3, the counter electrode layer 4031 is electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 10 μs to 100 μs, has optical isotropy, which makes the alignment process unneeded, and has a small viewing angle dependence Although an example of a transmissive liquid crystal display device is shown in this embodiment, an embodiment of the present invention can also be applied to a reflective liquid crystal display device or a transflective liquid crystal display device.

In this embodiment, an example of the liquid crystal display device is shown in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to that shown in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor obtained by Embodiment 6 is covered with the insulating layers (the insulating layer 4020 and the insulating layer 4021) serving as a protective film or a planarizing insulating film. Note that the protective film is provided to prevent entry of impurities floating in the air, such as an organic substance, a metal substance, or moisture, and is preferably a dense film. The protective film may be formed by sputtering to be a single-layer film or a multi-layer film of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although this embodiment shows an example of forming the protective film by sputtering, the present invention is not limited to this method and a variety of methods may be employed.

In this embodiment, the insulating layer having a multi-layer structure is formed as the protective film. As a first layer of the insulating layer 4020, a silicon oxide film is formed by sputtering. The use of the silicon oxide film as the protective film has an effect of preventing a hillock of an aluminum film used for the source and drain electrode layers.

The insulating layer is also formed as a second layer of the protective film. In this embodiment, as a second layer of the insulating layer 4020, a silicon nitride film is formed by sputtering. The use of the silicon nitride film as the protective film can prevent mobile ions such as sodium from entering a semiconductor region, thereby suppressing variations in electrical properties of the TFT.

After the protective film is formed, the IGZO semiconductor layer may be annealed (at 300° C. to 400° C.).

The insulating layer 4021 is formed as the planarizing insulating film. For the insulating layer 4021, an organic material having heat resistance, such as polyimide, acrylic, polyimide, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 4021 may be formed by stacking a plurality of insulating films formed of these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

There is no particular limitation on the method for forming the insulating layer 4021, and the insulating layer 4021 can be formed, depending on the material, by sputtering, SOG, spin coating, dipping, spray coating, droplet discharging (e.g., ink-jet, screen printing, or offset printing), doctor knife, roll coater, curtain coater, knife coater, or the like. In the case where the insulating layer 4021 is formed using a material solution, the IGZO semiconductor layer may be annealed (at 300° C. to 400° C.) at the same time of a baking step. The baking step of the insulating layer 4021 also serves as the annealing step of the IGZO semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, and the scanning line driver circuit 4004 or the pixel portion 4002 from an FPC 4018.

In this embodiment, a connecting terminal electrode 4015 is formed using the same conductive film as that of the pixel electrode layer 4030 included in the liquid crystal element 4013, and a terminal electrode 4016 is formed using the same conductive film as that of source and drain electrode layers of the thin film transistors 4010 and 4011.

The connecting terminal electrode 4015 is electrically connected to a terminal included in the FPC 4018 through an anisotropic conductive film 4019.

Note that FIGS. 21A to 21C illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 22:
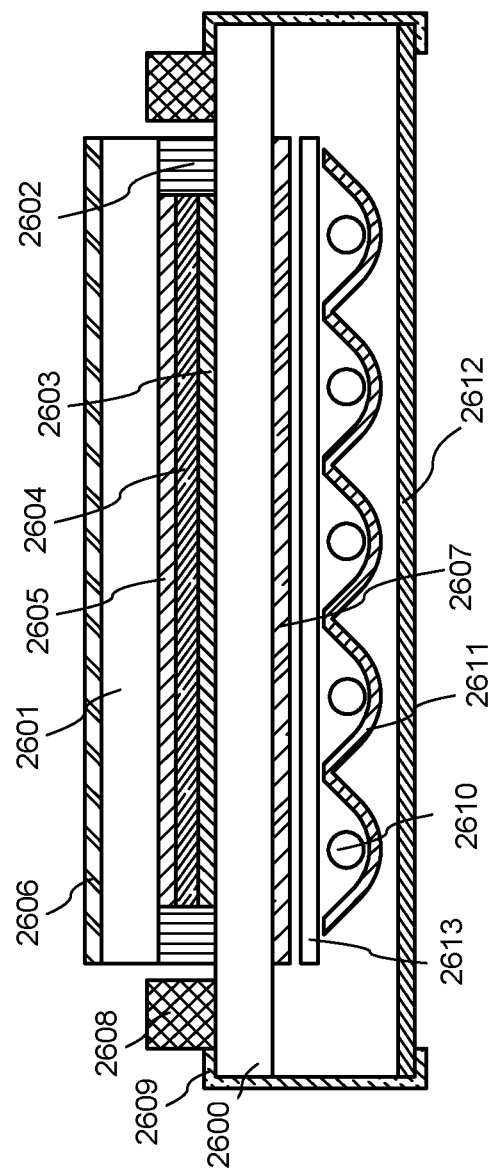
FIG. 22 is a diagram illustrating a semiconductor device.

FIG. 22 illustrates an example of a liquid crystal display module which is formed as a semiconductor device by using a TFT substrate 2600 manufactured by the present invention.

FIG. 22 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through the above process, a highly reliable liquid crystal display panel as a semiconductor device can be manufactured.

This embodiment can be implemented in appropriate combination with the structures described in the other embodiments.

Embodiment 10

In this embodiment, an example of electronic paper will be described as a semiconductor device of one embodiment of the present invention.

Figure 12:
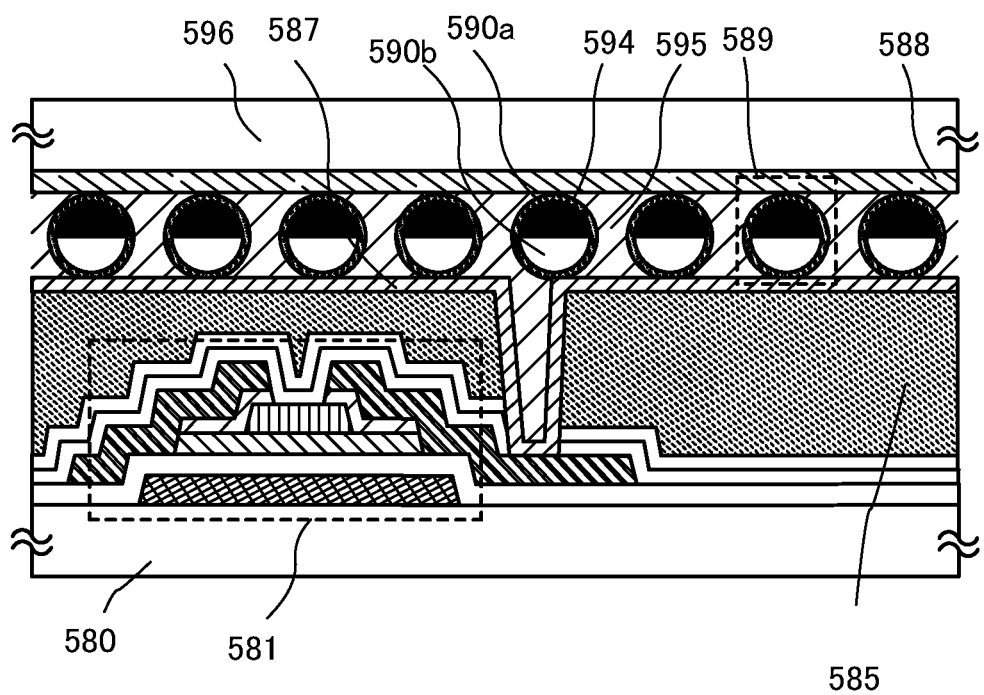
FIG. 12 is a diagram illustrating a semiconductor device.

FIG. 12 illustrates active matrix electronic paper as an example of a semiconductor device to which the present invention is applied. A thin film transistor 581 used for the semiconductor device can be manufactured in a manner similar to the thin film transistor shown in Embodiment 6 and is a highly reliable thin film transistor including an oxygen-excess oxide semiconductor layer as a channel formation region and an oxygen-deficient oxide semiconductor layer as source and drain regions. The thin film transistor shown in Embodiment 7 can also be used as the thin film transistor 581 of this embodiment.

The electronic paper in FIG. 12 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 interposed between a substrate 580 and a substrate 596 is a bottom-gate thin film transistor, and a source or drain electrode layer is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 12). In this embodiment, the first electrode layer 587 corresponds to the pixel electrode and the second electrode layer 588 corresponds to the common electrode. The second electrode layer 588 is electrically connected to a common potential line provided over the same substrate as the thin film transistor 581. With the use of the common connection portion show in any of Embodiments 1 to 3, the second electrode layer 588 is electrically connected to the common potential line through conductive particles provided between the pair of substrates.

Instead of the twisting ball, an electrophoretic element can also be used. A microcapsule having a diameter of about 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper as a semiconductor device can be manufactured.

This embodiment can be implemented in appropriate combination with the structures of the common connection portion described in any one of embodiments 1 to 5.

Embodiment 11

In this embodiment, an example of a light-emitting display device will be described as a semiconductor device of one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 19:
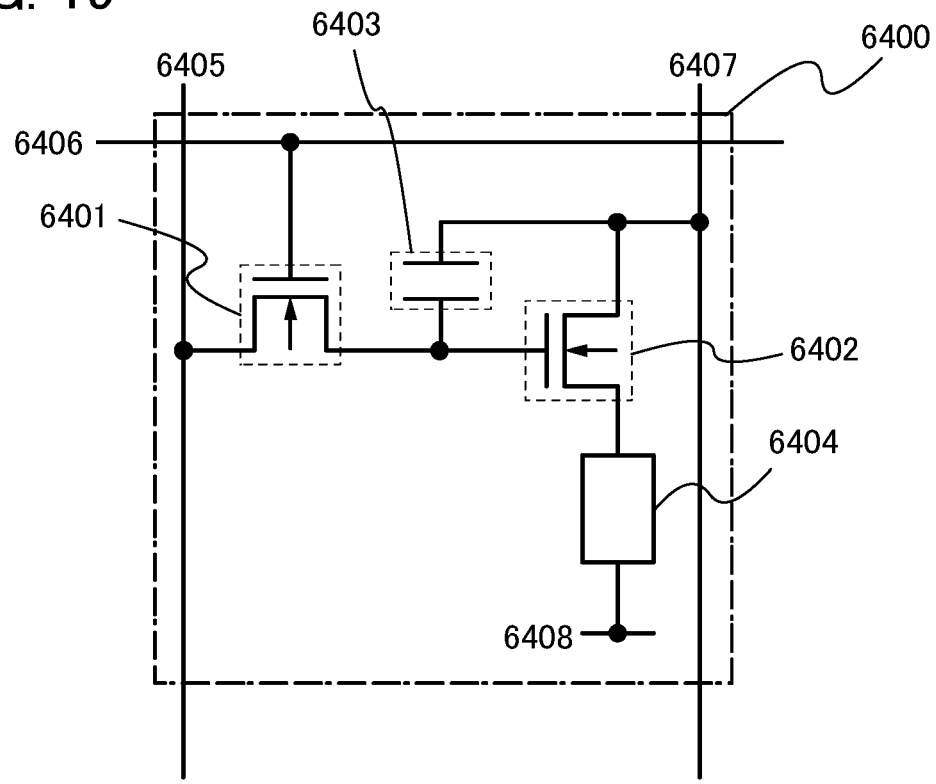
FIG. 19 is an equivalent circuit diagram of a pixel of a semiconductor device.

FIG. 19 illustrates an example of a pixel structure as an example of a semiconductor device of the present invention, which can be driven by a digital time grayscale method.

The structure and operation of a pixel which can be driven by a digital time grayscale method will be described. An example is shown here in which one pixel includes two n-channel transistors using an oxide semiconductor layer (an IGZO semiconductor layer) in a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the structure illustrated in FIG. 1A, FIG. 2A, or FIG. 3A may be obtained using the connection portion as a common connection portion.

Note that the second electrode (the common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 to flow current in the light-emitting element 6404, whereby the light-emitting element 6404 emits light. Thus, each potential is set so that the difference between the high power supply potential and the low power supply potential is equal to or higher than a forward threshold voltage.

When the gate capacitance of the driving transistor 6402 is used as a substitute for the capacitor 6403, the capacitor 6403 can be omitted. The gate capacitance of the driving transistor 6402 may be formed between a channel region and a gate electrode.

In the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage higher than or equal to (power supply line voltage+$V_{th}$ of the driving transistor 6402) is applied to the signal line 6405.

In the case of using an analog grayscale method instead of the digital time grayscale method, the same pixel structure as in FIG. 19 can be employed by inputting signals in a different way.

In the case of using the analog grayscale method, a voltage higher than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, current can flow in the light-emitting element 6404. In order to allow the driving transistor 6402 to operate in the saturation region, the potential of the power supply line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to that illustrated in FIG. 19. For example, the pixel in FIG. 26 can further include a switch, a resistor, a capacitor, a transistor, a logic circuit, or the like.

Next, structures of the light-emitting element will be described with reference to FIGS. 20A to 20C. A cross-sectional structure of a pixel will be described by taking an n-channel driving TFT as an example. Driving TFTs 7001, 7011, and 7021 used for semiconductor devices illustrated in FIGS. 20A to 20C can be manufactured in a manner similar to the thin film transistor described in Embodiment 6 and are highly reliable thin film transistors each including an oxygen-excess oxide semiconductor layer as a channel formation region and an oxygen-deficient oxide semiconductor layer as source and drain regions. Alternatively, the thin film transistor described in Embodiment 7 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of an embodiment of the present invention can be applied to a light-emitting element having any of these emission structures.

A light-emitting element having a top emission structure will be described with reference to FIG. 20A.

Figure 20A:
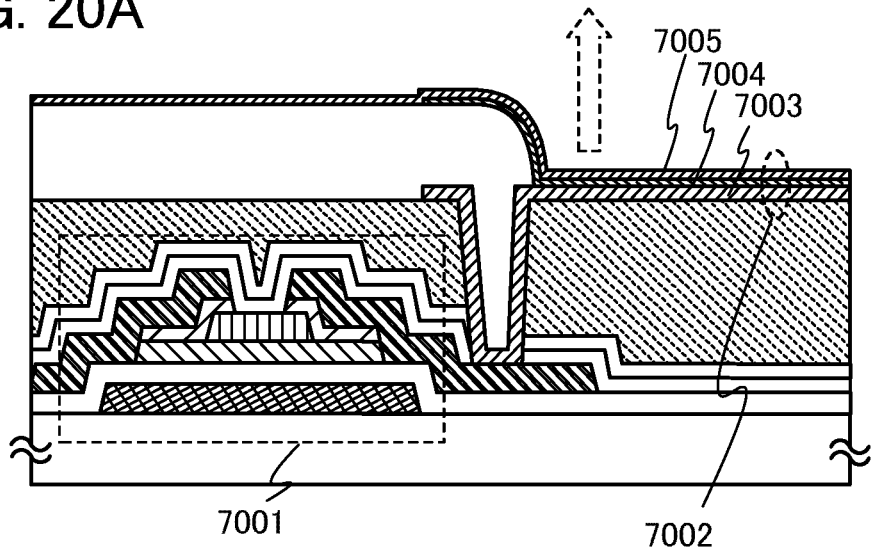
FIGS. 20A to 20C are diagrams each illustrating a semiconductor device.

FIG. 20A is a cross-sectional view of a pixel in the case where the driving TFT 7001 is of an n-type and light is emitted from a light-emitting element 7002 to an anode 7005 side. In FIG. 20A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 20A, light is emitted from the light-emitting element 7002 to the anode 7005 side as indicated by an arrow.

Next, a light-emitting element having a bottom emission structure will be described with reference to FIG. 20B. FIG. 20B is a cross-sectional view of a pixel in the case where the driving TFT 7011 is of an n-type and light is emitted from a light-emitting element 7012 to a cathode 7013 side. In FIG. 20B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 20A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 20A, the light-emitting layer 7014 may be formed using either a single layer or a plurality of layers stacked. The anode 7015 is not required to transmit light, but can be made of a light-transmitting conductive material like in the case of FIG. 20A. As the light-blocking film 7016, a metal which reflects light can be used for example; however, it is not limited to a metal film. For example, a resin to which black pigments are added can also be used.

The light-emitting element 7012 corresponds to a region where the cathode 7013 and the anode 7015 sandwich the light-emitting layer 7014. In the case of the pixel illustrated in FIG. 20B, light is emitted from the light-emitting element 7012 to the cathode 7013 side as indicated by an arrow.

Next, a light-emitting element having a dual emission structure will be described with reference to FIG. 20C. In FIG. 20C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 20A, the cathode 7023 can be made of a variety of conductive materials as long as they have a low work function. Note that the cathode 7023 is formed to have a thickness that can transmit light. For example, a film of Al having a thickness of 20 nm can be used as the cathode 7023. Like in FIG. 20A, the light-emitting layer 7024 may be formed using either a single layer or a plurality of layers stacked. The anode 7025 can be made of a light-transmitting conductive material like in the case of FIG. 20A.

The light-emitting element 7022 corresponds to a region where the cathode 7023, the light-emitting layer 7024, and the anode 7025 overlap with one another. In the case of the pixel illustrated in FIG. 20C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 20B:
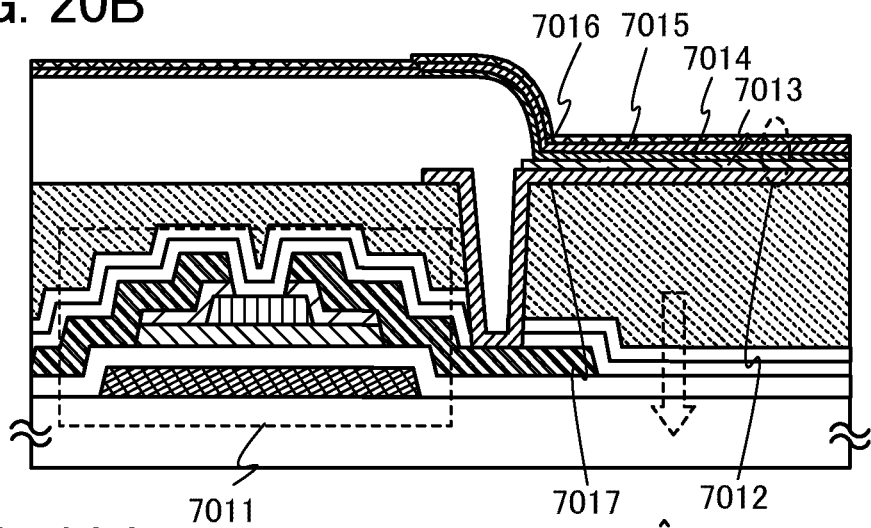
Figure 20C:
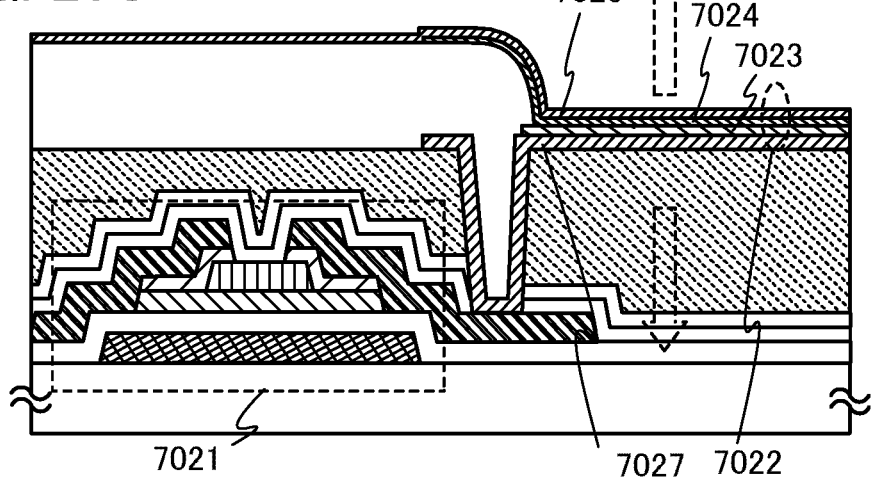

The structure of the semiconductor device described in this embodiment is not limited to those illustrated in FIGS. 20A to 20C and can be modified in various ways based on the spirit of techniques of the present invention.

Next, the appearance and a cross section of a light-emitting display panel, which is one embodiment of the semiconductor device of the present invention, will be described with reference to FIGS. 23A and 23B. FIG. 23A is a top view of a panel in which a thin film transistor and a light-emitting element are sealed between a first substrate and a second substrate with a sealant. FIG. 23B is a cross-sectional view taken along line H-I of FIG. 23A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 23B.

As the thin film transistors 4509 and 4510, the thin film transistor described in Embodiment 6, which includes an oxygen-excess oxide semiconductor layer as a channel formation region and an oxygen-deficient oxide semiconductor layer as source and drain regions, can be employed. Alternatively, the thin film transistor described in Embodiment 7 may be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stacked structure shown in this embodiment, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scanning line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 23A and 23B.

Through the above process, a highly reliable light-emitting display device (display panel) as a semiconductor device can be manufactured.

This embodiment can be implemented in appropriate combination with the structures described in the other embodiments.

Embodiment 12

A semiconductor device of one embodiment of the present invention can be applied to electronic paper. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. Examples of the electronic appliances are illustrated in FIGS. 24A and 24B and FIG. 25.

Figure 24A:
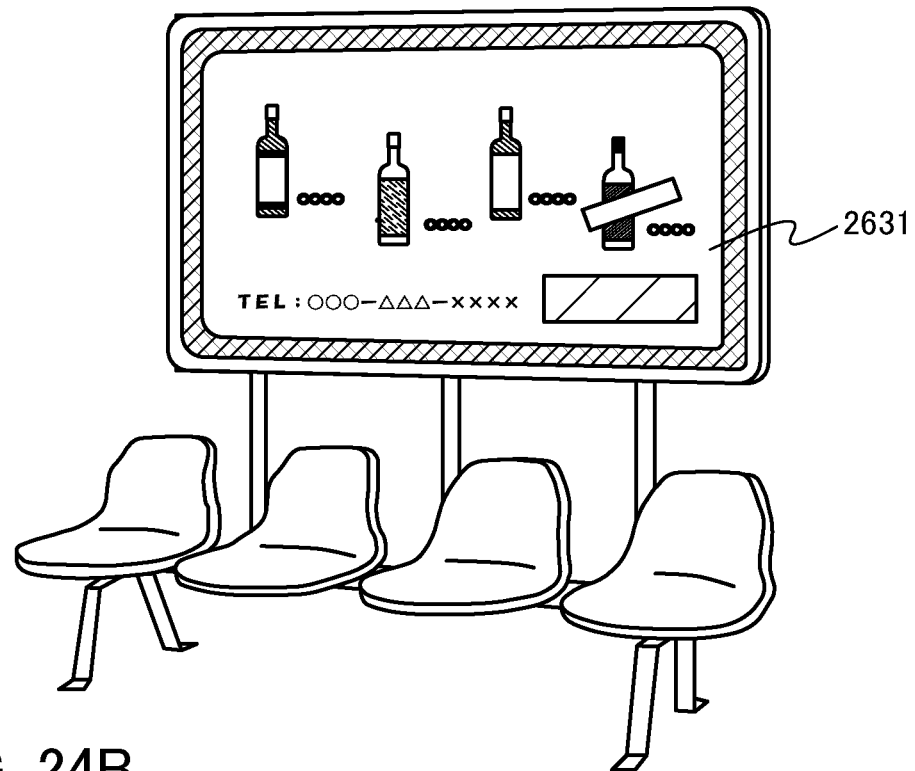
FIGS. 24A and 24B are views illustrating applications of electronic paper.

FIG. 24A illustrates a poster 2631 using electronic paper. In the case where an advertising medium is printed paper, the advertisement is replaced by hands; however, by using electronic paper to which the present invention is applied, the advertising display can be changed in a short time. Furthermore, stable images can be obtained without display defects. Note that the poster may have a configuration capable of wirelessly transmitting and receiving data.

Figure 24B:
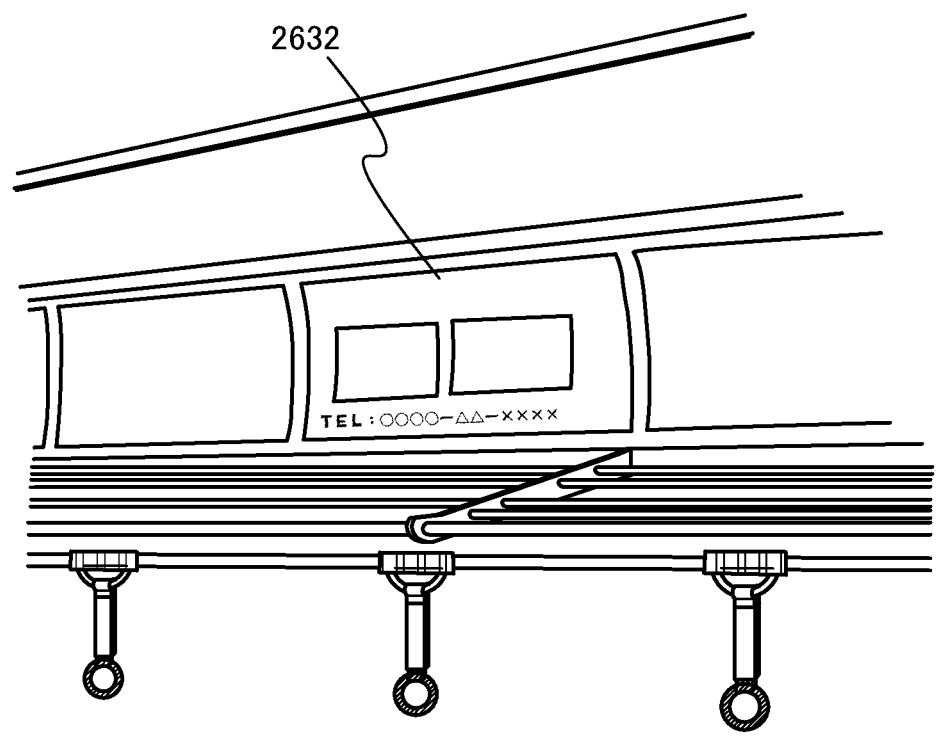

FIG. 24B illustrates an advertisement 2632 in a vehicle such as a train. In the case where an advertising medium is printed paper, the advertisement is replaced by hands; however, by using electronic paper to which the present invention is applied, the advertising display can be changed in a short time with less manpower. Furthermore, stable images can be obtained without display defects. Note that the advertisement in a vehicle may have a configuration capable of wirelessly transmitting and receiving data.

Figure 25:
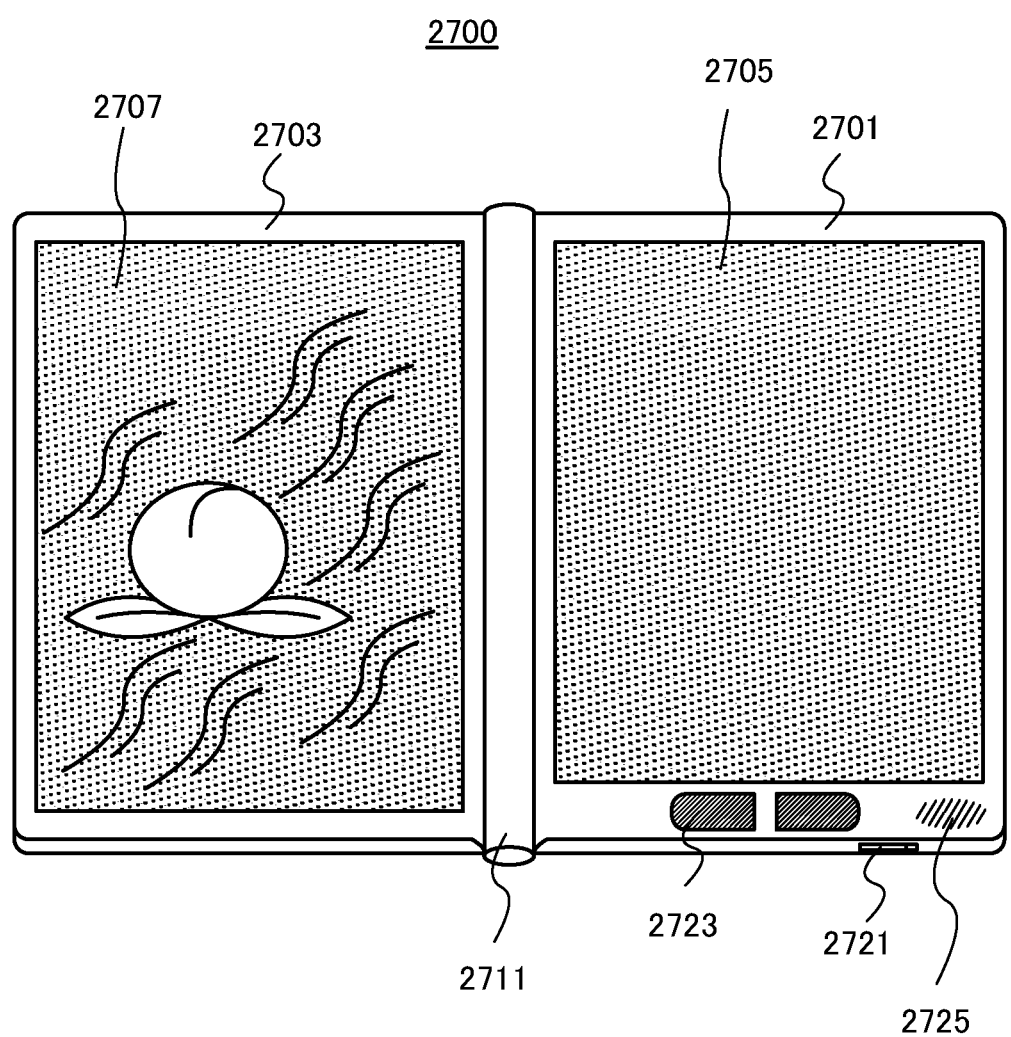
FIG. 25 is an external view illustrating an example of e-book reader.

FIG. 25 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 25) and graphics can be displayed on a display portion on the left side (the display portion 2707 in FIG. 25).

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 13

A semiconductor device of the present invention can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 26A:
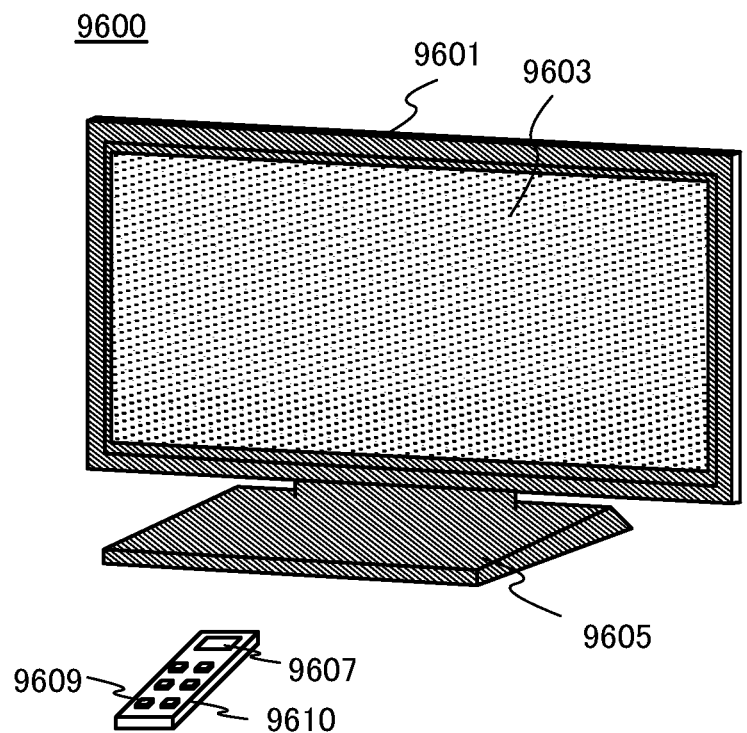
FIGS. 26A and 26B are external views illustrating a television set and a digital photo frame, respectively.

FIG. 26A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 26B:
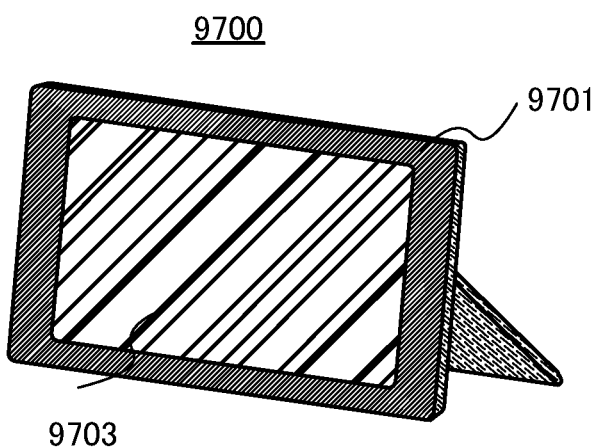

FIG. 26B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 27A:
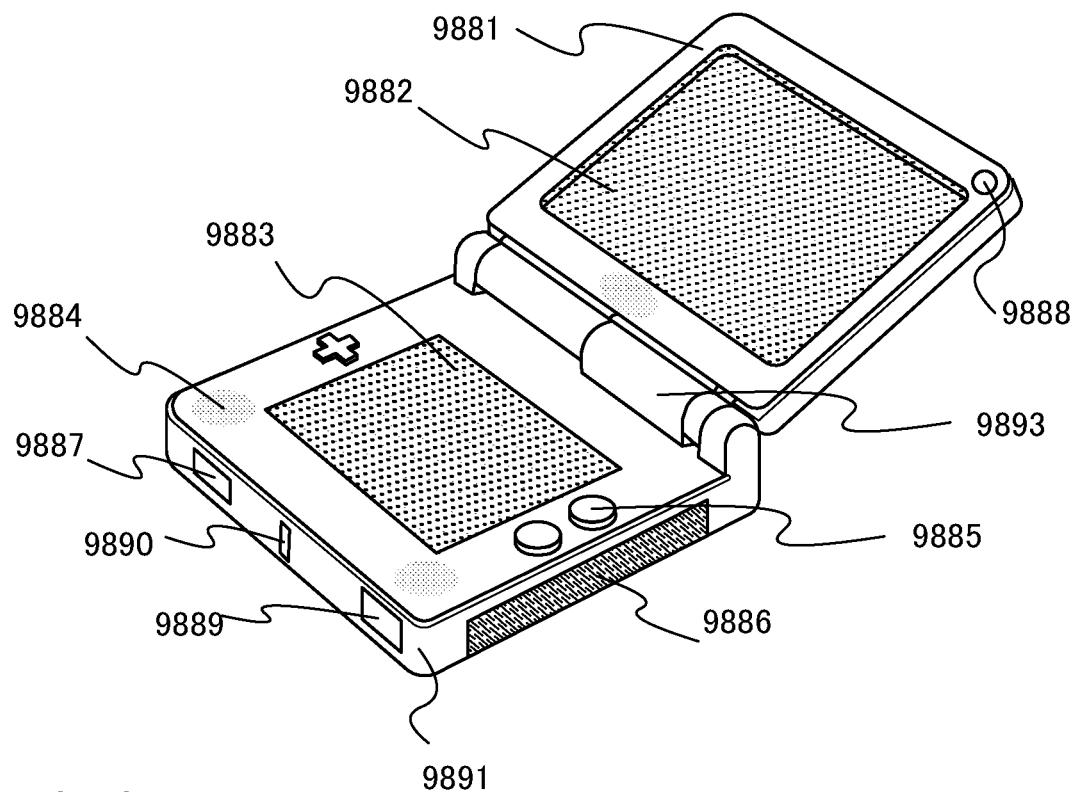
FIGS. 27A and 27B are external views illustrating examples of an amusement machine.

FIG. 27A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 27A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device of the present invention may be employed. The portable amusement machine may include other accessory equipment as appropriate. The portable amusement machine illustrated in FIG. 27A has a function of reading a program or data stored in a recording medium to display it on the display portion, and a function of sharing information with another portable amusement machine by wireless communication. The portable amusement machine illustrated in FIG. 27A can have various functions without limitation to the above.

Figure 27B:
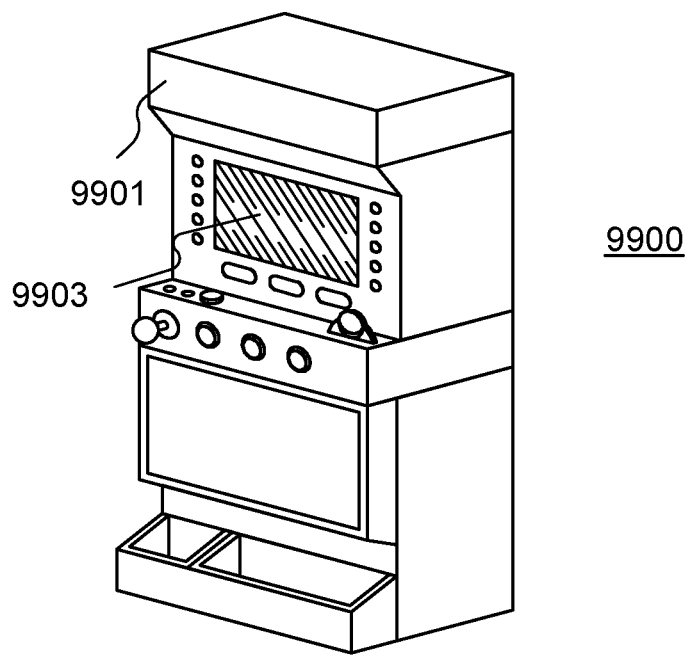

FIG. 27B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessory equipment as appropriate.

Figure 28:
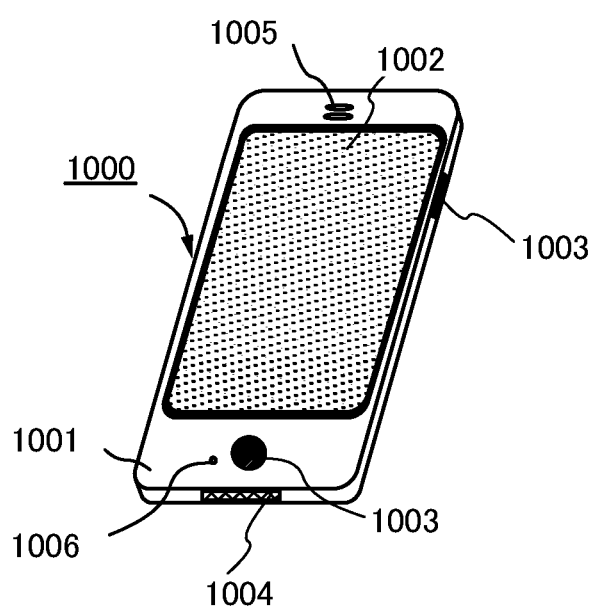
FIG. 28 is an external view illustrating a cellular phone.

FIG. 28 illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 28 is touched with a finger or the like, data can be input into the cellular phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or sensing light source emitting a near-infrared light for the display portion, an image of a finger vein, a palm vein, or the like can also be taken.

This application is based on Japanese Patent Application serial No. 2008-241307 filed with Japan Patent Office on Sep. 19, 2008, the entire contents of which are hereby incorporated by reference.

The invention claimed is:

1. A semiconductor device comprising:
   a gate electrode;
   a gate insulating layer over the gate electrode;
   a first oxide semiconductor layer including indium, gallium and zinc over the gate insulating layer;
   a second oxide semiconductor layer comprising indium, gallium and zinc over the first oxide semiconductor layer,
   a source electrode electrically connected to the first oxide semiconductor layer;
   a drain electrode electrically connected to the first oxide semiconductor layer; and
   a pixel electrode electrically connected to one of the source electrode and the drain electrode,
   wherein, in a plan view, an entire portion of the first oxide semiconductor layer overlaps with the gate electrode,
   wherein the first oxide semiconductor layer comprises an amorphous region, and
   wherein the second oxide semiconductor layer comprises a nanocrystal whose grain diameter is larger than or equal to 1 nm and smaller than or equal to 10 nm.

2. The semiconductor device according to claim 1, further comprising a channel protective layer over and in contact with the first oxide semiconductor layer,
   wherein the channel protective layer contains oxygen.

3. The semiconductor device according to claim 1,
   wherein the source electrode is in contact with a first side surface of the first oxide semiconductor layer and a first side surface of the second oxide semiconductor layer, and
   wherein the drain electrode is in contact with a second side surface of the first oxide semiconductor layer and a second side surface of the second oxide semiconductor layer.

* * * * *